US011706932B2

(12) United States Patent
Yao et al.

(10) Patent No.: US 11,706,932 B2
(45) Date of Patent: Jul. 18, 2023

(54) 1T1R RESISTIVE RANDOM ACCESS MEMORY, AND MANUFACTURING METHOD THEREOF, TRANSISTOR AND DEVICE

(71) Applicant: SHENZHEN GOODIX TECHNOLOGY CO., LTD., Shenzhen (CN)

(72) Inventors: Guofeng Yao, Shenzhen (CN); Jian Shen, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 293 days.

(21) Appl. No.: 16/896,951

(22) Filed: Jun. 9, 2020

(65) Prior Publication Data

US 2020/0303460 A1    Sep. 24, 2020

Related U.S. Application Data

(63) Continuation of application No. PCT/CN2019/077477, filed on Mar. 8, 2019.

(51) Int. Cl.
*H01L 29/66* (2006.01)
*H10B 63/00* (2023.01)
(Continued)

(52) U.S. Cl.
CPC ....... *H10B 63/30* (2023.02); *H01L 21/02164* (2013.01); *H01L 21/02236* (2013.01);
(Continued)

(58) Field of Classification Search
CPC ................ H01L 29/66666; H01L 27/2454
See application file for complete search history.

(56) References Cited

U.S. PATENT DOCUMENTS

| 2003/0146469 A1 | 8/2003 | Matsuoka |
| 2005/0201182 A1 | 9/2005 | Osada |
| 2006/0273298 A1 | 12/2006 | Petti |
| 2006/0278921 A1 | 12/2006 | Pellizzer |

(Continued)

FOREIGN PATENT DOCUMENTS

| CN | 102368536 A | 3/2012 |
| CN | 102637729 A | 8/2012 |

(Continued)

OTHER PUBLICATIONS

International Search Report for PCT/CN2019/077477.
The first Office Action of CN application No. 2019800003918.
The EESR of the parallel EPO application No. 19891684.3.

*Primary Examiner* — Mark V Prenty
(74) *Attorney, Agent, or Firm* — J.C. Patents

(57) ABSTRACT

The present disclosure provides a 1T1R resistive random access memory and a manufacturing method thereof, and a device. The 1T1R resistive random access memory includes: a memory cell array composed of multiple 1T1R resistive random access memory cells, each 1T1R resistive random access memory cell including a transistor and a resistance switching device (30). The transistor includes a channel layer (201), a gate layer (204) insulated from the channel layer (201), and a drain layer (203) and a source layer (202) disposed on the channel layer (201), and the drain layer (203) and the source layer (202) are vertically distributed on the channel layer (201). The resistance change device (30) is disposed near the drain layer (203). The disclosure reduces the area of a transistor, thereby significantly improving the memory density of the resistive random access memory.

19 Claims, 13 Drawing Sheets

(51) Int. Cl.
    *H01L 21/02*        (2006.01)
    *H01L 21/265*      (2006.01)
    *H01L 21/28*        (2006.01)
    *H01L 23/528*      (2006.01)
    *H01L 29/08*        (2006.01)
    *H01L 29/423*      (2006.01)
    *H10N 70/00*       (2023.01)

(52) U.S. Cl.
    CPC .. *H01L 21/26513* (2013.01); *H01L 21/28035* (2013.01); *H01L 23/528* (2013.01); *H01L 29/0847* (2013.01); *H01L 29/42376* (2013.01); *H01L 29/66568* (2013.01); *H10B 63/80* (2023.02); *H10N 70/021* (2023.02); *H10N 70/826* (2023.02); *H01L 21/02255* (2013.01)

(56) References Cited

U.S. PATENT DOCUMENTS

| | | |
|---|---|---|
| 2013/0270508 A1 | 10/2013 | Li |
| 2014/0124728 A1 | 5/2014 | Kim |
| 2014/0241038 A1 * | 8/2014 | Terai |
| 2018/0286977 A1 * | 10/2018 | Cheng ............... H01L 29/66666 |
| 2019/0348540 A1 * | 11/2019 | Pillarisetty ............ H01L 29/66 |

FOREIGN PATENT DOCUMENTS

| | | |
|---|---|---|
| CN | 102709192 A | 10/2012 |
| CN | 110024133 A | 7/2019 |
| EP | 1717861 A1 | 11/2006 |
| TW | I341587 B | 5/2011 |
| WO | WO2018118096 A1 | 6/2018 |

\* cited by examiner

1T1R RESISTIVE RANDOM ACCESS MEMORY, AND MANUFACTURING METHOD THEREOF, TRANSISTOR AND DEVICE

CROSS-REFERENCE TO RELATED APPLICATION

This application is a continuation of International Application No. PCT/CN2019/077477, filed on Mar. 8, 2019, the disclosure of which is hereby incorporated by reference in its entirety.

TECHNICAL FIELD

The disclosure relates to the field of memory technology, and in particular, to a 1T1R resistive random access memory and a manufacturing method thereof, a transistor, and a device.

BACKGROUND

Resistive random access memory (RRAM) is a new type of non-volatile memory (NVM) that implements data storage based on the variable resistance of a device, which has attracted much attention due to its advantages such as low operating power consumption and fast read/write speeds. 1T1R is a common memory cell structure of RRAM, where T stands for transistor, and R stands for resistance switching device.

A current RRAM array architecture and a memory cell with an 1T1R structure are shown in FIG. 1a and FIG. 1b, where FIG. 1a is a schematic diagram of the RRAM array architecture with the 1T1R structure in the prior art, and FIG. 1b is a schematic diagram of a single 1T1R memory cell in the prior art. As shown in FIG. 1b, each memory cell comprises a transistor 10 and a resistance switching device 11. The transistor 10 is composed of a monocrystalline silicon substrate 100, a source 102, a drain 104, a gate 101, and a gate dielectric layer 103. The resistance switching device 11 is composed of a lower electrode 110, a resistance switching layer 111, and an upper electrode 112. The drain 104 of the transistor 10 is electrically connected to the lower electrode 110 of the resistance switching device 11 through a contact 106, a metal layer 107, a via 108, and the like. The upper electrode 112 of the resistance switching device 11 is electrically connected to the metal layer 109 through a via 108. The metal layer 109 is connected to a bit line (BL for short). The resistance of the resistance switching device changes with a voltage applied, and according to a value of the resistance, it can be divided into a low resistance state and a high resistance state which may corresponding to logic "1" and "0", respectively. The process of writing the low resistance state is called "set", specific steps of which are as follows: turn on a transistor through a word line (WL for short) voltage to select a corresponding row; apply a write voltage to a BL of a corresponding column, and a source line (SL for short) of the corresponding column is grounded, and the voltage on BL can complete the "set" process of RRAM. The process of writing the high resistance state is called "reset", and its steps are similar to writing the low resistance state, except that the write voltage is applied to the SL of the corresponding column, and the BL is grounded. Steps of a reading process are as follows: a WL selects a corresponding row, a SL of a corresponding column is grounded and a reading voltage is applied to a BL to complete the reading process. During the reading process, the transistor is used to gate the resistance switching device, thereby avoiding the problem of misreading.

However, an area of the foregoing 1T1R memory cell mainly depends on an area of the transistor, and the area of the transistor in the foregoing structure is difficult to be reduced, and thus the area of the memory cell can hardly be made small, thereby limiting the memory density.

SUMMARY

The disclosure provides a 1T1R resistive random access memory, and a manufacturing method thereof, a transistor and a device, which reduce the area of the transistor, thereby significantly improving the memory density of the resistive random access memory, and solving the problem of the existing 1T1R resistive random access memory that the memory density is limited due to that the transistor area cannot be reduced.

This disclosure provides a 1T1R resistive random access memory, including: a memory cell array composed of multiple 1T1R resistive random access memory cells, each 1T1R resistive random access memory cell including a transistor and a resistance switching device;

the transistor includes a channel layer, a gate layer insulated from the channel layer, and a drain layer and a source layer disposed on the channel layer, where the drain layer and the source layer are vertically distributed on the channel layer;

the resistance switching device is disposed near the drain layer, and two ends of the resistance switching device are used to connect to the drain layer and a bit line, respectively, and the gate layer is used to electrically connect to a word line, and the source layer is used to connect to a source line.

In a specific implementation of this disclosure, specifically, the drain layer is disposed on one end of a top end and a bottom end of the channel layer, and the source layer is disposed on the other.

In a specific implementation of this disclosure, specifically, the gate layer is disposed around an outer wall of the channel layer, and a gate dielectric layer is disposed between the gate layer and the channel layer.

In a specific implementation of this disclosure, specifically, further include:

an isolation layer, where the isolation layer is disposed around an outer surface of the gate layer, and is used to isolate adjacent transistors.

In a specific implementation of this disclosure, specifically, further include: a mask layer, where the mask layer covers at least the source layer or covers at least the drain layer.

In a specific implementation of this disclosure, specifically, further include: a buried oxide layer, and one of the buried oxide layer and the mask layer covers at least the source layer, and the other covers at least the drain layer.

In a specific implementation of this disclosure, specifically, further include: a first dielectric layer, where the first dielectric layer is provided on one end surface of the transistor, and at least a first metal wire is provided in the first dielectric layer, where the first metal wire is used to electrically connect one of the source layer and the drain layer near the first dielectric layer to a corresponding wire.

In a specific implementation of this disclosure, specifically, further include: a second dielectric layer, where the second dielectric layer is disposed on one end surface of the transistor facing away from the first dielectric layer, and at least a second metal wire is provided in the second dielectric layer, where the second metal wire is used to electrically connect one of the source layer and the drain layer near the second dielectric layer to a corresponding wire.

In a specific implementation of this disclosure, specifically, a third metal wire is further disposed in the first dielectric layer or the second dielectric layer, where the third metal wire is used to connect the gate layer to a corresponding word line electrically.

In a specific implementation of this disclosure, specifically, further include: a slide wafer, where the slide wafer is provided on one of the first dielectric layer and the second dielectric layer far from the buried oxide layer.

In a specific implementation of this disclosure, specifically, the resistance switching device includes a lower electrode, a resistive switching layer and an upper electrode which are sequentially stacked, where the lower electrode is electrically connected to the drain layer, and the upper electrode is electrically connected to the bit line.

In a specific implementation of this disclosure, specifically, the first metal wire, the second metal wire, and the third metal wire each comprise at least one contact and at least one metal layer, the gate layer, the source layer and the drain layer are respectively electrically connected to corresponding metal layers through the contact, the metal layer in the first dielectric layer is electrically connected to first pads exposed on the first dielectric layer, and the metal layer in the second dielectric layer is electrically connected to a second pads exposed on the second dielectric layer.

In a specific implementation of this disclosure, specifically, the channel layer is a columnar structure, and the gate layer is an annular structure disposed around a sidewall of the columnar structure.

In a specific implementation of this disclosure, specifically, the mask layer, the buried oxide layer, the isolation layer, and the gate dielectric layer are all made of silicon oxide.

The disclosure also provides a transistor, including a channel layer, a gate layer insulated from the channel layer, and a drain layer and a source layer that are disposed on the channel layer, where the drain layer and the source layer are vertically distributed on the channel layer.

In a specific implementation of this disclosure, specifically, the drain layer is disposed on one of a top end and a bottom end of the channel layer, and the source layer is disposed on the other end.

In a specific implementation of this disclosure, specifically, the gate layer is disposed around an outer wall of the channel layer, and a gate dielectric layer is provided between the gate layer and the channel layer.

In a specific implementation of this disclosure, specifically, further include:
an isolation layer, where the isolation layer is disposed around an outer surface of the gate layer, and is used to isolate adjacent transistors.

In a specific implementation of this disclosure, specifically, further include: a mask layer, where the mask layer covers at least the source layer or covers at least the drain layer.

In a specific implementation of this disclosure, specifically, further include: a buried oxide layer, where one of the buried oxide layer and the mask layer covers at least the source layer, and the other covers at least the drain layer.

The disclosure further provides a device including the 1T1R resistive random access memory as described above.

The disclosure further provides a device including the transistor as described above.

The disclosure provides a manufacturing method for a 1T1R resistive random access memory, the method includes:
providing a substrate, where the substrate includes a support layer, a buried oxide layer and a silicon layer which are sequentially stacked;
forming a mask layer on the silicon layer;
forming a single or multiple spaced annular grooves which are extending from the mask layer to the buried oxide layer, so that a single or multiple columnar structures are formed on the substrate, and a groove bottom of the annular groove extends into the buried oxide layer;
forming a thermal oxide layer on a sidewall of the annular groove;
forming a gate layer by filling polysilicon in the annular groove;
forming a source layer by implanting a P-type doped element or an N-type doped element into an end of the columnar structure facing the mask layer;
forming a drain layer by implanting a P-type doped element or an N-type doped element into an end of the columnar structure where the silicon layer is in contact with the buried oxide layer;
disposing a resistance switching device near the drain layer, where one end of the resistance switching device is electrically connected to the drain layer.

In a specific implementation of this disclosure, specifically, before implanting a P-type doped element or an N-type doped element into an end of the columnar structure facing the mask layer, the method further includes:
reducing a thickness of the masking layer to 8 nm to 20 nm.

In a specific implementation of this disclosure, specifically, the forming a thermal oxide layer on a sidewall of the annular groove, includes:
forming a first thermal oxide layer on an inner circular sidewall of the annular groove, where the first thermal oxide layer is used to insulate the gate layer from the gate dielectric layer of the columnar structure;
forming a second thermal oxidation layer on an outer circular sidewall of the annular groove, where the second thermal oxidation layer is used to isolate two adjacent gate layers.

In a specific implementation of this disclosure, specifically, before implanting a P-type doped element or an N-type doped element into an end of the columnar structure where the silicon layer is in contact with the buried oxide layer, the method further includes:
removing the support layer;
reducing a thickness of the buried oxide layer to 8 nm to 20 nm.

In a specific implementation of this disclosure, specifically, after implanting a P-type doped element or an N-type doped element into an end of the columnar structure facing the mask layer, the method further includes:
forming a lower dielectric layer on the mask layer and on an end surface of the gate layer near the mask layer;
forming a gate metal layer, a source metal layer, and first pads that is electrically connected to the gate metal layer and the source metal layer on the lower dielectric layer;
covering a first inter-metal dielectric layer on the lower dielectric layer on which the gate metal layer, the source metal layer and the first pads are formed, where the gate metal layer and the source metal layer are electrically connected to the gate layer and the source layer through a contact, respectively;
disposing a slide wafer on the first inter-metal dielectric layer.

In a specific implementation of this disclosure, specifically, after implanting a P-type doped element or an N-type doped element into an end of the columnar structure where the silicon layer is in contact with the buried oxide layer, the method further includes:

forming an upper dielectric layer on the buried oxide layer and on an end surface of the gate layer near the buried oxide layer;

the disposing a resistance switching device near the drain layer includes:

disposing the resistance switching device on the upper dielectric layer at a position corresponding to the drain layer, where the resistance switching device includes a lower electrode, a resistance switching layer and an upper electrode that are stacked, and the lower electrode is electrically connected to the drain layer via a contact.

In a specific implementation of this disclosure, specifically, after disposing the resistance switching device on the upper dielectric layer at a position corresponding to the drain layer, the method further includes:

disposing a second inter-metal dielectric layer on the upper dielectric layer on which the resistive random device is formed;

forming a drain metal layer and a second pads that is electrically connected to the drain metal layer on the second inter-metal dielectric layer, where the drain metal layer is electrically connected to the upper electrode through a contact;

covering a third inter-metal dielectric layer on the second inter-metal dielectric layer on which the drain metal layer and the second pads are formed.

In a specific implementation of this disclosure, specifically, after covering a third inter-metal dielectric layer on the second inter-metal dielectric layer on which the drain metal layer and the second pads are formed, the method further comprises:

opening a first opening and a second opening on the third inter-metal dielectric layer at positions corresponding to the first pads and the second pads, respectively, where the first opening extends to a surface of the first pads, and the second opening extends to a surface of the second pads.

In the 1T1R resistive random access memory provided by the disclosure, the transistor includes a columnar channel layer, an annular gate layer surrounding a side surface of the channel layer, and a gate dielectric layer between the channel layer and the gate layer.

The drain layer is disposed on one of the top surface and the bottom surface of the channel layer, and the source layer is disposed on the other. The resistance switching device is disposed near the drain layer, and two ends of the resistance switching device are respectively used to connect to the drain layer and a bit line. The gate layer is used to electrical connect to a word line, and the source layer is used to connect to a source line. In the way, the minimum footprint of the transistor is reduced to $4F^2$, which compared with the transistor in the prior art, is greatly reduced, and thus the area of each 1T1R resistive random access memory cell is reduced, and the memory density is increased. Therefore, the 1T1R resistive random access memory provided in the embodiments reduces the footprint of the transistor and increases the memory density, thereby solving the problem of the existing 1T1R resistive random access memory that the memory density is limited due to that the transistor area cannot be reduced.

BRIEF DESCRIPTION OF DRAWINGS

In order to explain the technical solutions in the embodiments of the present disclosure or the prior art more clearly, the drawings used in the description of the embodiments or the prior art will be briefly introduced below. Obviously, the drawings in the following description are some embodiments of the present disclosure. For those skilled in the art, other drawings can be obtained based on these drawings without any creative effort.

LIST OF REFERENCE SIGNS 201 channel layer;
202 source layer;
203 drain layer;
204 gate layer;
205 gate dielectric layer;
206 isolation layer;
207 mask layer;
208 buried oxide layer;
30 resistance switching device;
31 upper electrode;
32 resistance switching layer;
33 lower electrode;
41 first dielectric layer;
42 second dielectric layer;
411 lower dielectric layer;
421 upper dielectric layer;
412 first inter-metal dielectric layer;
422 second inter-metal dielectric layer;
423 third inter-metal dielectric layer;
401 first metal wire;
402 second metal wire;
403 third metal wire;
501 first pads;
5011 first opening;
502 second pads;
5021 second opening;
51 first metal layer;
52 second metal layer;
53 third metal layer;
54 fourth metal layer;
61 first contact;
62 second contact;
63 third contact;
64 fourth contact;
70 slide wafer.

DESCRIPTION OF EMBODIMENTS

In order to make the objectives, technical solutions, and advantages of the embodiments of the present disclosure clearer, the technical solutions in the embodiments of the present disclosure will be clearly and completely described with reference to the accompanying drawings in the embodiments of the present disclosure. Obviously, the described embodiments are part of the embodiments of the present disclosure, but not all the embodiments. Based on the embodiments in the present disclosure, all other embodiments obtained by those skilled in the art without creative efforts shall fall within the protection scope of the present disclosure.

As described in the background, in the prior art, the 1T1R resistive random access memory has a problem of limited memory density. After research by the inventors, it is found that the reason for this problem is as follows. The area of the memory cell in the existing 1T1R resistive random access memory mainly depends on the area of the transistor 10, the structure of which is shown in FIG. 1b to FIG. 1d, where the source layer 102 and the drain layer 104 are located on the left and right sides of the gate layer 101, respectively. During operation, the transmission of carriers is along the horizontal direction, which eventually makes the footprint of the transistor approximately $10F^2$, where F is the characteristic line width of the process node. Such a structure of the transistor makes it impossible to reduce the footprint of the transistor, thereby causing the area of the memory cell to be hardly made small, thereby limiting the memory density.

Based on the above reasons, the present disclosure provides a 1T1R resistive random access memory. The 1T1R resistive random access memory provided in the present disclosure will be described below with reference to several embodiments.

First Embodiment

Figure 2A:
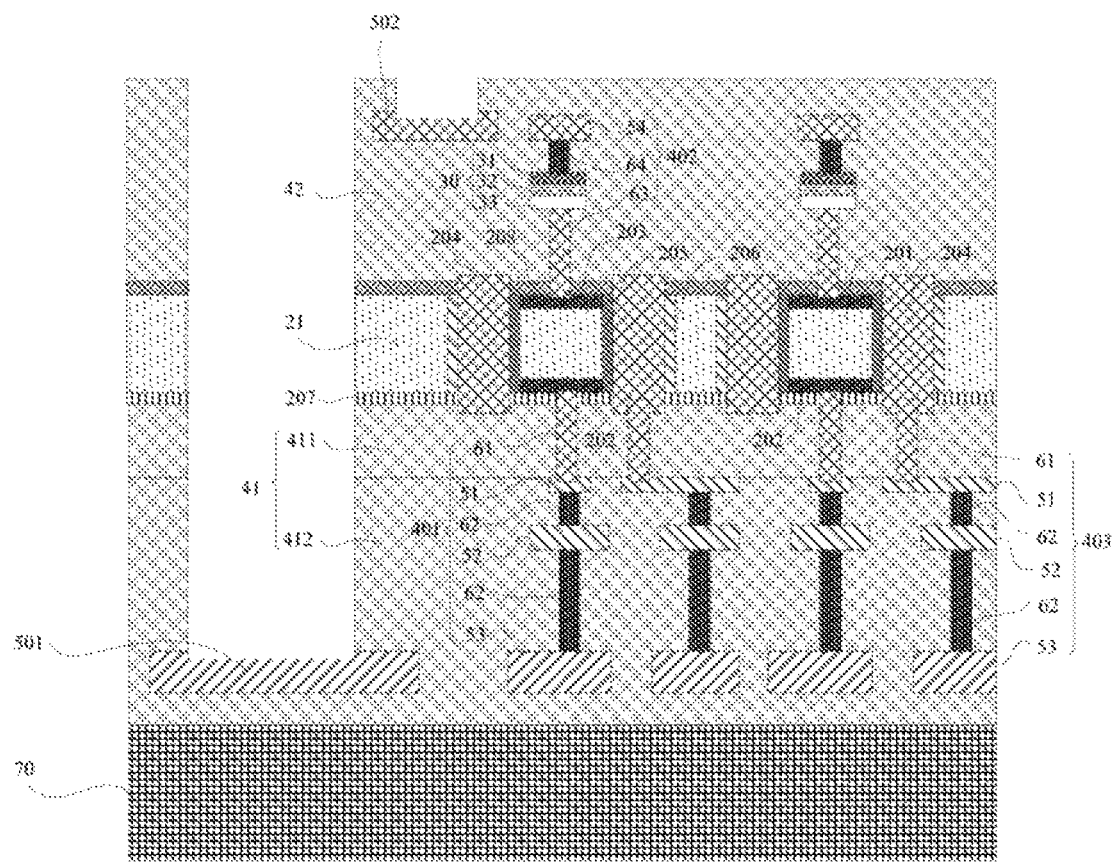
FIG. 2a is a structural schematic diagram of the cross-sectional view of a 1T1R resistive random access memory according to a first embodiment of the present disclosure.
Figure 2B:
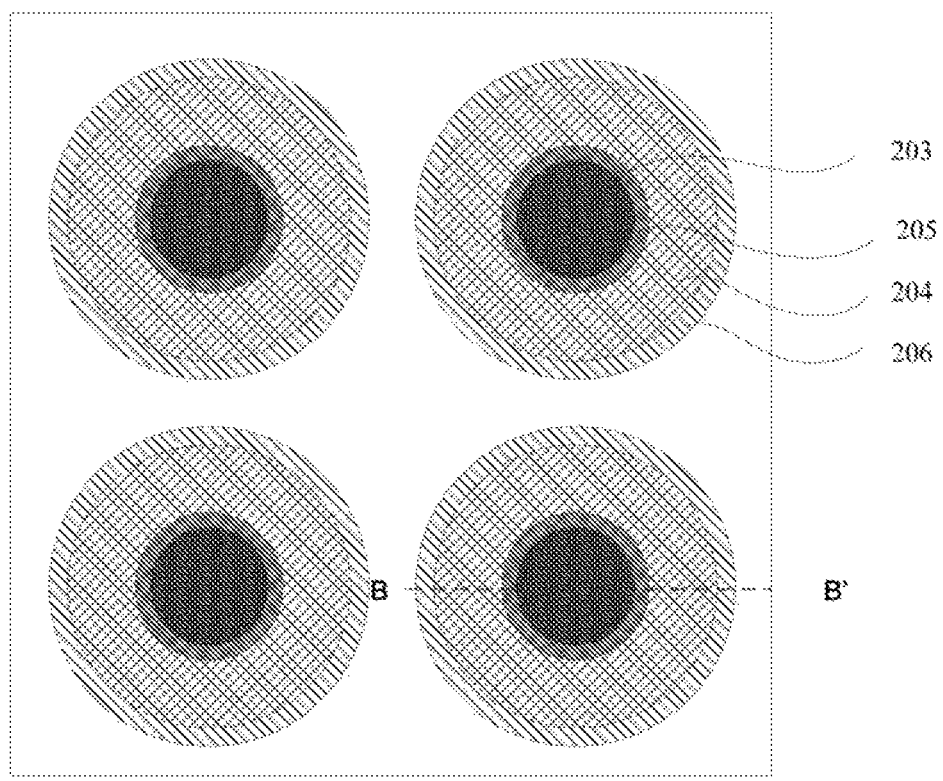
FIG. 2b is a structural schematic diagram of the top view of a transistor in the 1T1R resistive random access memory according to the first embodiment of the present disclosure.
Figure 2C:
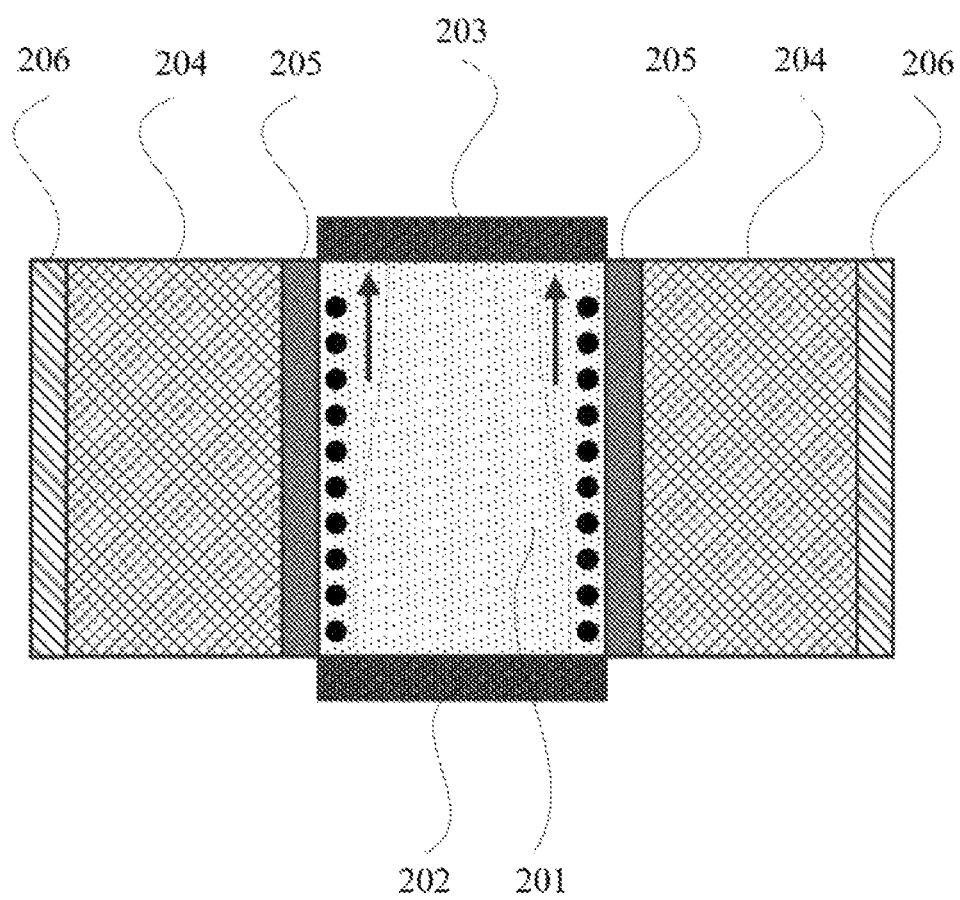
FIG. 2c is a structural schematic diagram of the cross-sectional view in the direction B-B in FIG. 2b.

FIG. 2a is a structural schematic diagram of the cross-sectional view of a 1T1R resistive random access memory according to the first embodiment of the present disclosure. FIG. 2b is a structural schematic diagram of the top view of a transistor in the 1T1R resistive random access memory according to the first embodiment of the present disclosure. FIG. 2c is a structural schematic diagram of the cross-sectional view in the direction B-B in FIG. 2b.

Figure 1A:
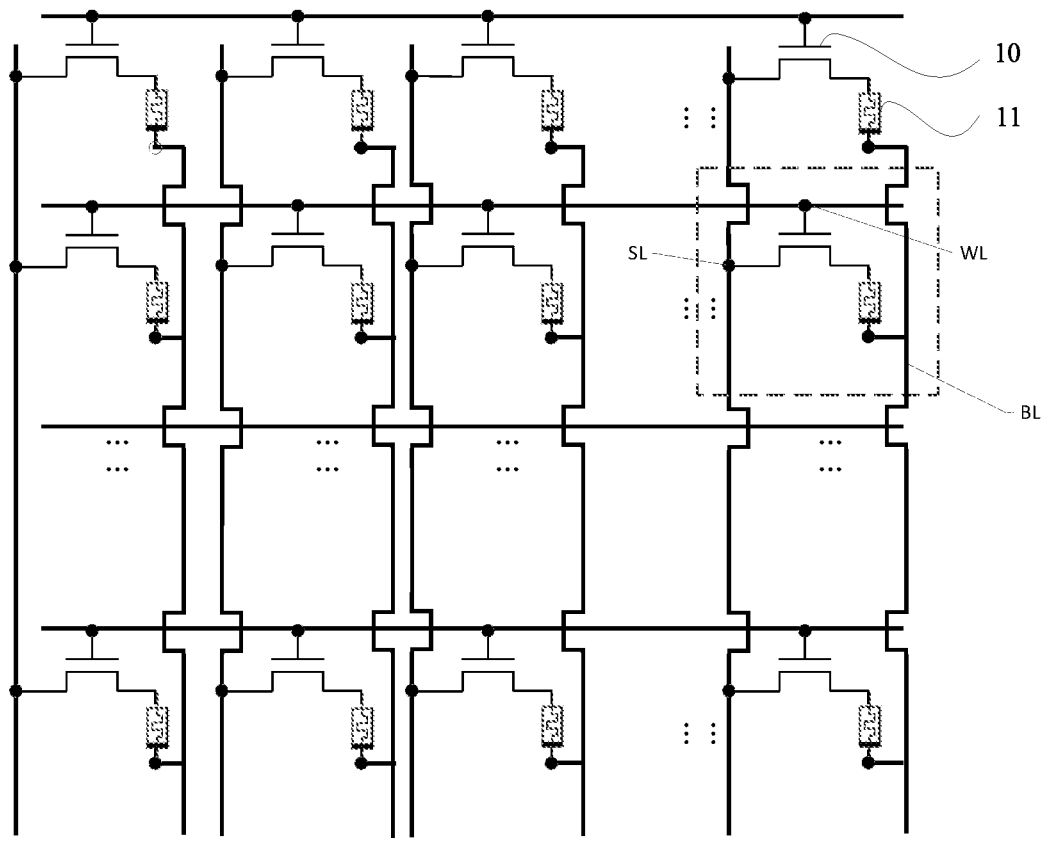
FIG. 1a is a schematic diagram of an RRAM array architecture with a 1T1R structure according to the prior art.
Figure 1B:
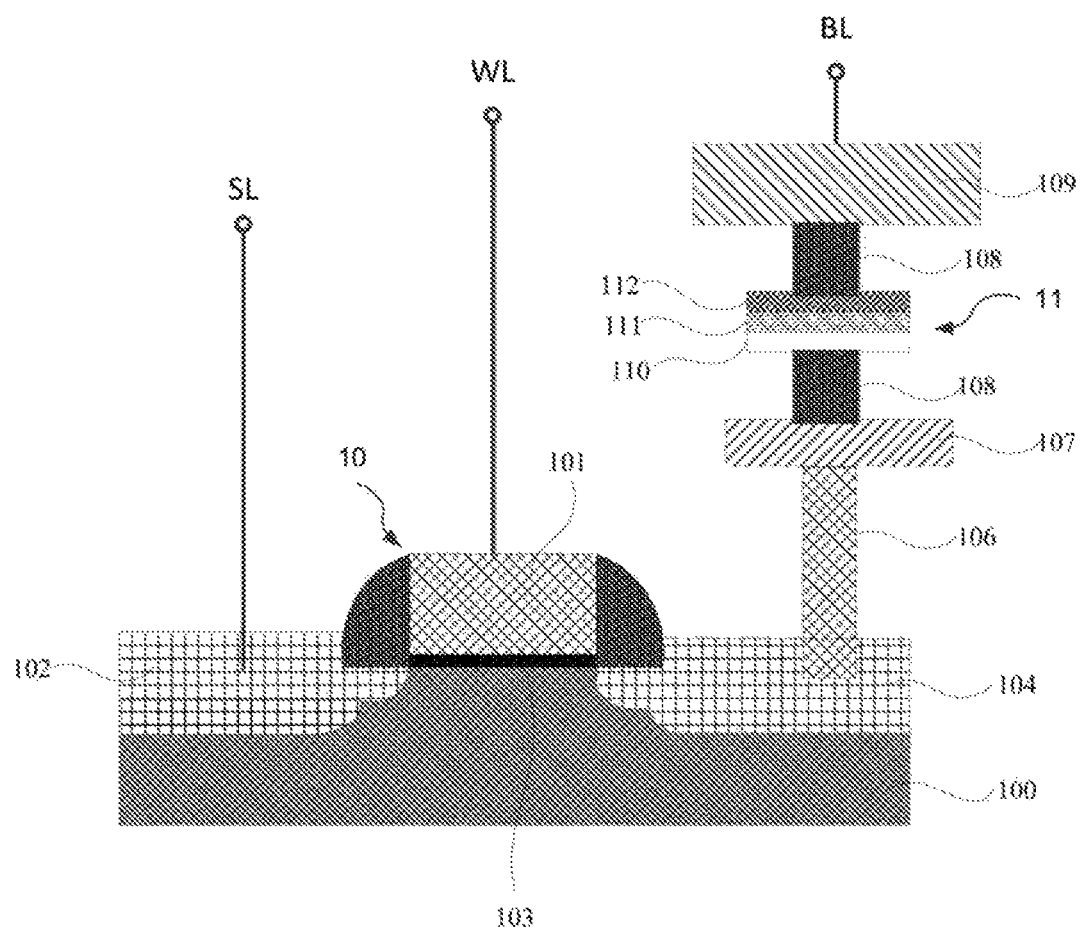
FIG. 1b is a schematic diagram of a single 1T1R memory cell according to the prior art.
Figure 1C:
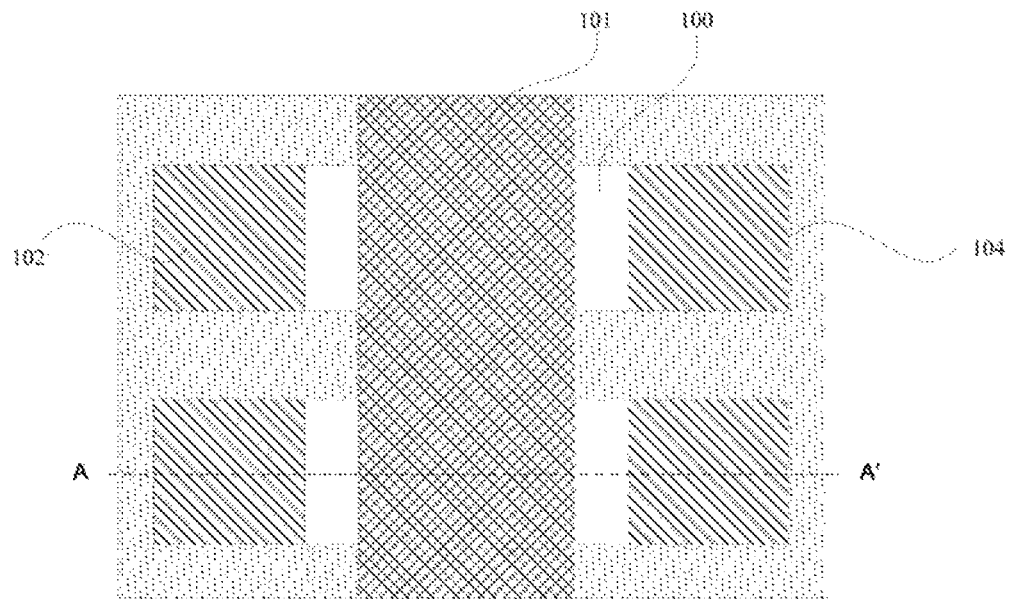
FIG. 1c is a structural schematic diagram of the top view of a transistor in a 1T1R memory cell in the prior art.
Figure 1D:
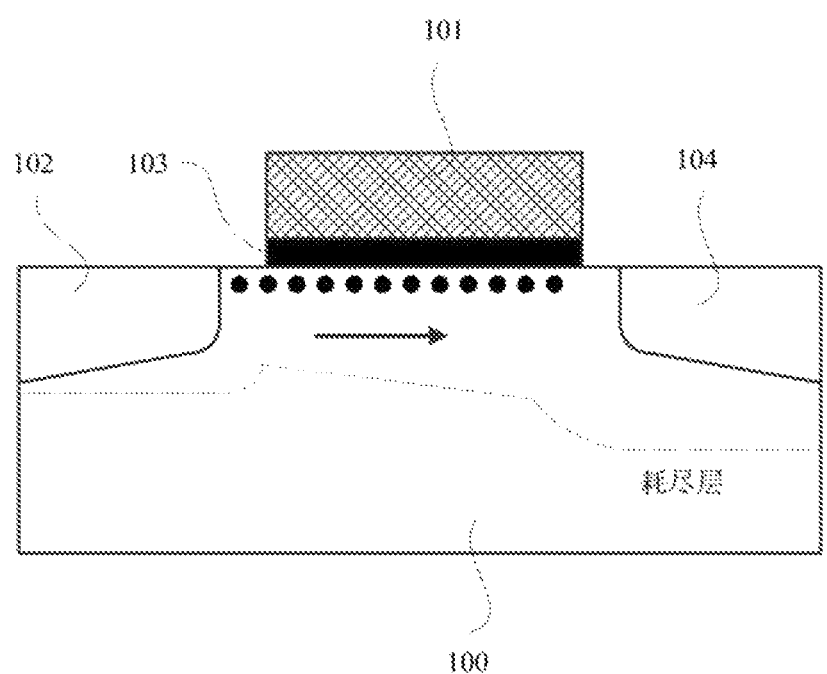
FIG. 1d is a structural schematic diagram of the cross-sectional view in the direction A-A in FIG. 1c.

As shown in FIGS. 2a-2c, the 1T1R resistive random access memory includes: a memory cell array composed of multiple 1T1R resistive random access memory cells, where FIG. 1a can be specifically referred to for the memory cell array composed of multiple 1T1R resistive random access memory cells, where each 1T1R resistive random access memory cell includes a transistor and a resistance switching device 30. In this embodiment, in order to reduce the footprint of the transistor, specifically, the transistor includes a channel layer 201, a gate layer 204 insulated from the channel layer 201, and a drain layer 203 and a source layer 202 disposed on the channel layer 201, and the drain layer 203 and the source layer 202 are vertically distributed on the channel layer 201, that is, the drain layer 203 and the source layer 202 are sequentially distributed along the vertical direction of the channel layer 201, e.g. the drain layer 203 may be located above the channel layer 201, the source layer 202 is located below the channel layer 201, and the drain layer 203 and the source layer 202 are vertically arranged on the channel layer 201. In this disclosure, since the drain layer 203 and the source layer 202 are vertically distributed on the channel layer 201, compared with the horizontal distribution of the drain layer and the source layer in the prior art (as shown in FIG. 1b), the footprint of the transistor in the horizontal direction is greatly reduced in the provided embodiment.

It can be obtained by measuring the transistor provided in this embodiment that the transistor has a minimum footprint of $4F^2$ only, and the footprint of the transistor provided in this embodiment is greatly reduced compared with the footprint $10F^2$ of the transistor in the prior art, which leads to a great reduction in the area of a single 1T1R resistive random access memory cell and thereby significant improvement of the memory density.

In this embodiment, the resistance switching device 30 needs to be electrically connected to the drain layer 203. Therefore, the resistance switching device 30 is disposed near the drain layer 203, and two ends of the resistance switching device 30 are respectively used to connect to the drain layer 203 and a bit line. In this embodiment, the gate layer 204 is used to electrically connect to a word line, and the source layer 202 is used to connect to a source line.

In this embodiment, the channel layer 201 is specifically a silicon layer, and the element doped in the channel layer 201 is different for different types of transistors (N-type transistors and P-type transistors). For example when the transistor is an N-type transistor, the channel layer 201 is often doped with boron (P-type doping), and when the transistor is a P-type transistor, the channel layer 201 is often doped with phosphorus (N-type doping), with a possible doping concentration of $1E15$ $cm^{-3}$.

In this embodiment, the gate layer 204 is specifically made of doped polysilicon; the source layer 202 and the drain layer 203 are formed by a heavily doped silicon layer made of a silicon layer doped with an N-type doped element or a P-type doped element. The gate dielectric layer 205 is used to insulate the gate layer 204 from the channel layer 201 and is specifically made of silicon oxide. In this embodiment, the thickness of the gate dielectric layer 205 may be 10 nm. In this embodiment, the gate layer 204, the source layer 202, the drain layer 203 and the gate dielectric layer 205 include but not limited to the foregoing materials, and can also be made of other materials.

Therefore, in the 1T1R resistive random access memory provided in this embodiment, the transistor includes a channel layer 201, a gate layer 204 insulated from the channel layer 201, and a drain layer 203 and a source layer 202 that are disposed on the channel layer 201, and the drain layer and the source layer are vertically distributed on the channel layer. In this way, the minimum footprint of the transistor is reduced to $4F^2$. which compared with the transistor in the prior art, is greatly reduced, and thus leads to a great reduction in the area of each 1T1R resistive random access memory cell, and an increase in the memory density. Therefore, the 1T1R resistive random access memory provided in this embodiment reduces the footprint of the transistor and increases the memory density, thereby solving the problem of the existing 1T1R resistive random access memory that the memory density is limited due to that the transistor area cannot be reduced.

Further, on the basis of the foregoing embodiment, in this embodiment, the drain layer 203 is disposed on one of the top end and the bottom end of the channel layer 201, and the source layer 202 is disposed on the other. Specifically, as shown in FIG. 2c, the channel layer 201 has a side surface, a top surface, and a bottom surface. The gate layer 204 is disposed around the side surface of the channel layer 201 in a round, and finally the gate layer 204 and the channel layer 201 form a columnar structure together. Meanwhile, the drain layer 203 is disposed on the top surface of the channel layer 201 and the source layer 202 is disposed on the bottom surface, that is, the drain layer 203 and the source layer 202 are located on the upper and lower ends of the channel layer 201, respectively. In this embodiment, for example, the drain layer 203 may be disposed on the top surface of the channel layer 201 and the source layer 202 may be disposed on the bottom surface of the channel layer 201, or the source layer 202 may also be disposed on the top surface of the channel layer 201 and the drain layer 203 may be disposed on the bottom surface of the channel layer 201, to form a vertical columnar transistor, during the operation of which, carriers migrate in a vertical direction.

In the embodiment, the gate layer 204 is disposed around the outer sidewall of the channel layer 201, and the gate dielectric layer 205 is disposed between the gate layer 204 and the channel layer 201, where the gate dielectric layer 205 is used to separate the gate layer 204 from the channel layer 201. In the embodiment, when the gate layer 204 is disposed around the outer sidewall of the channel layer 201, the gate layer 204 is disposed surrounding the outer sidewall of the channel layer 201 for a round, and finally the gate layer 204 has a barrel structure. In this embodiment, the thickness of the gate layer 204 only needs to meet the requirements. Compared with the horizontal width of the source layer and the drain layer in the prior art, the wall thickness of the gate layer 204 in this embodiment is much smaller than the horizontal width of the source layer and the drain layer in the prior art, so compared with the prior art, the footprint of the formed transistor is greatly reduced in this embodiment.

Further, on the basis of the above embodiments, this embodiment further includes: an isolation layer 206, which is disposed around the outer surface of the gate layer 204, and is used to isolate adjacent transistors. That is, in this embodiment, the two transistors are isolated by the isolation layer 206 in order to avoid conduction between the gate layers 204 of two adjacent transistors. In this embodiment, the isolation layer 206 and the gate dielectric layer 205 may be film layers made of the same material, for example, the isolation layer 206 may also be made of silicon oxide. Specifically, in this embodiment, the isolation layer 206 and the gate dielectric layer 205 may be formed by a thermal oxidation process. Specifically, the condition of the thermal oxidation process may be 850° C./1 h, and a silicon oxide layer with a thickness of 10 nm is formed. The thermal silicon oxide layer on the outer sidewall of the channel layer 201 is used as the gate dielectric layer 205, and the thermal oxidation layer on the outer side surface of the gate layer 204 serves as the isolation layer 206.

Further, on the basis of the above embodiments, this embodiment further includes: a mask layer 207, which covers at least the source layer 202 or covers at least the drain layer 203. In this embodiment, as shown in FIG. 2a, the mask layer 207 covers the source layer 202 and the end surface of the gate dielectric layer 205 near the source layer 202. During manufacturing the transistor, the mask layer 207 can protect the source layer 202 in an etching process.

Further, on the basis of the foregoing embodiment, this embodiment also includes a buried oxide layer 208. One of the buried oxide layer 208 and the mask layer 207 covers at least the source layer 202, and the other covers at least the drain layer 203. In this embodiment, the mask layer 207 covers at least the source layer 202, and the buried oxide layer 208 covers at least the drain layer 203. As shown in FIG. 2a, the buried oxide layer 208 specifically covers the drain layer 203 and the end surface of the gate dielectric layer 205 near the drain layer 203. In this embodiment, the buried oxide layer 208 is specifically made of silicon dioxide, and the buried oxide layer 208 protects the drain layer 203.

Further, on the basis of the above embodiments, in this embodiment, in order to realize the electrical connection of the gate layer 204 with the word line, the electrical connection of the source layer 202 with the source line, and the electrical connection of the drain layer 203 with the resistance switching device and the bit line, specifically, this embodiment further includes: a first dielectric layer 41, which is disposed on one end surface of the transistor. In this embodiment, as shown in FIG. 2a, the first dielectric layer 41 is disposed on an end of the transistor facing the source layer 202. The first dielectric layer 41 could cover the mask layer 207, and one end surface of the gate layer 204 and the gate dielectric layer 205, that is, the source layer 202 is close to the first dielectric layer 41. Alternatively, in this embodiment, the first dielectric layer 41 may also be disposed on an end surface of the transistor near the drain layer 203, and in this way the drain layer 203 is close to the first dielectric layer 41. In this embodiment, at least a first metal wire 401 is disposed in the first dielectric layer 41, and the first metal wire 401 is used to electrically connect one of the source layer 202 and the drain layer 203 near the first dielectric layer 41 to a corresponding wire. For example, in the choice of the source layer 202 and the drain layer 203, if it is the source layer 202 near the first dielectric layer 41, the first metal wire 401 is used to electrically connect the source layer 202 to the corresponding source line (SL); in the choice of the source layer 202 and the drain layer 203, if it is the drain layer 203 near the first dielectric layer 41, the first metal wire 401 is used to electrically connect the drain layer 203 to the corresponding bit line (BL). And since the two ends of the resistance switching device 30 are respectively connected to the drain layer 203 and the bit line, at this time, the two ends of the resistance switching device 30 are electrically connected to the drain layer 203 and the bit line through the first metal wire 401, respectively.

Further, on the basis of the above embodiments, this embodiment further includes: a second dielectric layer 42, and the second dielectric layer 42 is disposed on one end surface of the transistor facing away from the first dielectric layer 41. That is, in this embodiment, the first dielectric layer 41 and the second dielectric layer 42 are respectively located on two end surfaces of the transistor. As shown in FIG. 2a, the first dielectric layer 41 is disposed on one end of the transistor near the source layer 202, and the second dielectric layer 42 is disposed on the other end of the transistor near the drain layer 203. Or in this embodiment, the first dielectric layer 41 may also be disposed on one end of the transistor near the drain layer 203, and the second dielectric layer 42 is disposed on the other end of the transistor near the source layer 202. In this embodiment, at least a second metal wire 402 is disposed in the second dielectric layer 42, and the second metal wire 402 is used to electrically connect one of the source layer 202 and the drain layer 203 near the second dielectric layer 42 to a corresponding wire. As shown in FIG. 2a, the second dielectric layer 42 is disposed near the drain layer 203, so at this time the second metal wire 402 is used to connect to the drain layer 203 to the corresponding wire. In this embodiment, when the second dielectric layer 42 is disposed near the source layer 202, the second metal line is used to electrically connect the source layer 202 to the corresponding source line.

In this embodiment, as shown in FIG. 2a, when the second dielectric layer 42 is disposed near the drain layer 203, the resistance switching device 30 may be disposed in the second dielectric layer 42 and near the drain layer 203. At this time, the resistance switching device 30 is connected to the drain layer 203 and the bit line through the second metal wire 402, respectively. Or in this embodiment, when the first dielectric layer 41 is disposed near the drain layer 203, the resistance switching device 30 may be disposed in the first dielectric layer 41. At this time, the resistance switching device 30 is connected to the drain layer 203 and the bit line through the first metal wire 401, respectively. That is, in this embodiment, the resistance switching device 30 is located in a dielectric layer located near the drain layer 203.

In this embodiment, as shown in FIG. 2a, the resistance switching device 30 includes a lower electrode 33, a resistance switching layer 32 and an upper electrode 31 which are sequentially stacked; where the lower electrode 33 is electrically connected to the drain layer, and the upper electrode 31 is electrically connected to the bit line.

In this embodiment, a third metal wire 403 is also provided in the first dielectric layer 41 or the second dielectric layer 42, that is, the first dielectric layer may be provided with the first metal wire 401 and the third metal wire 403, or the second dielectric layer is provided with the second metal wire 402 and the third metal wire 403, where the third metal wire 403 is used to electrically connect the gate layer to the corresponding word line. As shown in FIG. 2a, in this embodiment, the third metal wire 403 is specifically disposed in the first dielectric layer 41, that is, the first dielectric layer 41 is provided with the first metal wire 401 and the third metal wire 403. In FIG. 2a, the first metal wire 401 electrically connects the source layer 202 to the corresponding source line, and the third metal wire 403 electrically connects the end of the gate layer 204 facing the first dielectric layer 41 to the corresponding word line. Alternatively, in this embodiment, the third metal wire 403 may be located in the second dielectric layer 42. At this time, one end of the third metal wire 403 is connected to one end of the gate layer 204 facing the second dielectric layer 42, and the other end is connected to the word line.

In this embodiment, each of the first metal wire 401, the second metal wire 402, and the third metal wire 403 includes at least one contact and at least one metal layer. The gate layer 204, the source layer 202 and the drain layer 203 are respectively electrically connected to the corresponding metal layers through the contact, and the metal layer in the first dielectric layer 41 is electrically connected to first pads exposed on the first dielectric layer 41, and the metal layer in the second dielectric layer 42 is electrically connected to a second pads exposed on the second dielectric layer 42. Specifically, in this embodiment, as shown in FIG. 2a, each of the first metal wire 401 and the third metal wire 403 includes a first contact 61, a second contact 62, a first metal layer 51, a second metal layer 52 and a third metal layer 53. The first metal layers 51 in the first metal wire 401 and the third metal wire 403 are electrically connected to the source layer 202 and the gate layer 204 through the first contacts 61, respectively. The first metal layer 51, the second metal layer 52 and the third metal layer 53 are electrically connected to each other through the second contacts 62. And the third metal layers 53 in the first metal wire 401 and the third metal wire 403 are electrically connected to the first pads exposed on the first dielectric layer 41. That is, in the embodiment, the gate layer 204 and the source layer 202 are connected to the first pads 501 through the first metal wire 401 and the third metal wire 403, respectively, and connect to the word line and the power supply of the source line through the first pads 501. In this embodiment, the first pads 501 is disposed in the first dielectric layer 41 through providing an opening to expose. When the first pads 501 is exposed, it is convenient for the first pads 501 to be electrically connected.

It should be noted that the number of contacts and metal layers in the first metal wire 401 and the third metal wire 403 includes, but is not limited to, the first contact 61, the second contact 62, the first metal layer 51, the second metal layer 52 and the third metal layer 53 described above. In other embodiments, the number of contacts and metal layers in the source metal wire and the gate metal wire may be one or more layers, and the specific number of layers is determined according to the requirements of circuit wiring.

In this embodiment, as shown in FIG. 2a, the second metal wire 402 specifically includes a third contact 63, a fourth contact 64 and a fourth metal layer 54, and the lower electrode 33 and the drain layer 203 are electrically connected through the third contact 63, the upper electrode 31 and the fourth metal layer 54 are electrically connected through the fourth contact 64, and the fourth metal layer 54 is electrically connected to the second pads 502 exposed on the second dielectric layer 42.

It should be noted that the number of the contacts and the metal layers in the second metal wire 402 includes, but is not limited to, the above-mentioned third contact 63, the fourth contact 64, and the fourth metal layer 54. In other embodiments, the number of contacts and metal layers in the second metal wire 402 may be one or more layers, and the specific number of layers is determined according to the requirements of circuit wiring.

Further, on the basis of the above embodiments, this embodiment further includes: a slide wafer 70, which is disposed on one of the first dielectric layer 41 and the second dielectric layer 42 far from the buried oxide layer 208. That is, in this embodiment, in the choice of the first dielectric layer 41 and the second dielectric layer 42, if the first dielectric layer 41 is far from the buried oxide layer 208 (as shown in FIG. 2a, the second dielectric layer 42 and the buried oxide layer 208 are located on one side of the transistor, and the first dielectric layer 41 is located on the other side of the transistor, which means that the first dielectric layer 41 is far from the buried oxide layer 208), then the slide wafer 70 is disposed on the first dielectric layer 41, and specifically, the slide wafer 70 is disposed on a side of the first dielectric layer 41 facing away from the transistor. In the choice of the first dielectric layer 41 and the second dielectric layer 42, if the second dielectric layer 42 is far from the buried oxide layer 208, then the slide wafer 70 is disposed on the second dielectric layer 42, and specifically, the slide wafer 70 is disposed on a side of second dielectric layer 42 facing away from the transistor. In this embodiment, the slide wafer 70 plays a supporting role in the manufacturing process of the drain layer 203 and the resistance switching device 30. Specifically, in this embodiment, the slide wafer 70 and the first dielectric layer 41 can be fixedly connected by bonding.

Further, on the basis of the above embodiment, in this embodiment, the channel layer 201 is a columnar structure, which may be specifically a cylindrical structure or a square columnar structure, and the gate layer 204 is an annular structure disposed around the sidewall of the columnar structure. In this embodiment, as shown in FIG. 2a and FIG. 2b, the channel layer 201 has a cylindrical structure, and the formed transistor is a vertical cylindrical transistor of which a minimum footprint is $4F^2$. It should be noted that, in this embodiment, the channel layer 201 may also be a square column, and the gate layer 204 is a square annular structure at this time.

Second Embodiment

This embodiment provides a transistor as shown in FIG. 2c. The transistor includes a channel layer 201, a gate layer 204 insulated from the channel layer 201, and a drain layer 203 and a source layer 202 disposed on the channel layer 201. The drain layer 203 and the source layer 202 are vertically distributed on the channel layer 201, that is, the drain layer 203 and the source layer 202 are sequentially distributed along the vertical direction of the channel layer 201, for example, the drain layer 203 may be located above the channel layer 201, the source layer 202 is located below the channel layer 201, and the drain layer 203 and the source layer 202 are vertically arranged on the channel layer 201. In this disclosure, since the drain layer 203 and the source layer 202 are vertically distributed on the channel layer 201, compared with the horizontal distribution of the drain layer and the source layer in the prior art (as shown in FIG. 1b), the footprint of the transistor in the horizontal direction is greatly reduced.

In this embodiment, since the drain layer 203 and the source layer 202 are vertically distributed on the channel layer 201, carriers migrate in a vertical direction when the transistor is operating. It can be obtained by measuring the transistor provided in this embodiment that the columnar transistor has a minimum footprint of $4F^2$ only, and the footprint of the transistor provided in this embodiment is greatly reduced compared with the footprint $10F^2$ of the transistor in the prior art. Therefore, when the transistor is applied to a resistive random access memory cell, the area of the resistive random access memory cell is reduced, leading to significant improvement of the memory density.

Further, on the basis of the foregoing embodiment, in this embodiment, the drain layer 203 is disposed on one of the top end and the bottom end of the channel layer 201, and the source layer 202 is disposed on the other. Specifically, as shown in FIG. 2c, the channel layer 201 has a side surface, a top surface, and a bottom surface. The gate layer 204 is disposed around the side surface of the channel layer 201 in a round, and finally the gate layer 204 and the channel layer 201 form a columnar structure together. Meanwhile, the drain layer 203 is disposed on the top surface of the channel layer 201 and the source layer 202 is disposed on the bottom surface, that is, the drain layer 203 and the source layer 202 are located on the upper and lower ends of the channel layer 201, respectively. In this embodiment, for example, the drain layer 203 may be disposed on the top surface of the channel layer 201 and the source layer 202 may be disposed on the bottom surface of the channel layer 201; or the source layer 202 may also be disposed on the top surface of the channel layer 201 and the drain layer 203 may be disposed on the bottom surface of the channel layer 201, to form a vertical columnar transistor. Carriers migrate in a vertical direction when the transistor is operating.

In the embodiment, the gate layer 204 is disposed around the outer sidewall of the channel layer 201, and the gate dielectric layer 205 is disposed between the gate layer 204 and the channel layer 201, where the gate dielectric layer 205 is used to separate the gate layer 204 from the channel layer 201. In the embodiment, when the gate layer 204 is disposed around the outer sidewall of the channel layer 201, the gate layer 204 is disposed surrounding the outer sidewall of the channel layer 201 for a round, and finally the gate layer 204 has a barrel structure. In this embodiment, the thickness of the gate layer 204 only needs to meet the requirements. Compared with the horizontal width of the source layer and the drain layer in the prior art, the wall thickness of the gate layer 204 in this embodiment is much smaller than the horizontal width of the source layer and the drain layer in the prior art, so compared with the prior art, the footprint of the formed transistor is greatly reduced in this embodiment.

Further, on the basis of the above embodiments, this embodiment further includes: an isolation layer 206, which is disposed around the outer surface of the gate layer 204, and is used to isolate adjacent transistors. That is, in this embodiment, the two transistors are isolated by the isolation layer 206 in order to avoid conduction between the gate layers 204 of two adjacent transistors. In this embodiment, the isolation layer 206 and the gate dielectric layer 205 may be film layers made of the same material, for example, the isolation layer 206 may also be made of silicon oxide. Specifically, in this embodiment, the isolation layer 206 and the gate dielectric layer 205 may be formed by a thermal oxidation process. Specifically, the condition of the thermal oxidation process may be 850°/1 h, and a silicon oxide layer with a thickness of 10 nm is formed. The thermal silicon oxide layer on the outer sidewall of the channel layer 201 is used as the gate dielectric layer 205, and the thermal oxidation layer on the outer side surface of the gate layer 204 serves as the isolation layer 206.

Further, on the basis of the above embodiments, this embodiment further includes: a mask layer 207, which covers at least the source layer 202 or covers at least the drain layer 203. In this embodiment, as shown in FIG. 2a, the mask layer 207 covers the source layer 202 and the end surface of the gate dielectric layer 205 near the source layer 202. During manufacturing the transistor, the mask layer 207 can protect the source layer 202 in an etching process.

Further, on the basis of the above embodiments, this embodiment further includes: a buried oxide layer 208. One of the buried oxide layer 208 and the mask layer 207 covers at least the source layer 202, and the other covers at least the drain layer 203. In this embodiment, the mask layer 207 covers at least the source layer 202, and the buried oxide layer 208 covers at least the drain layer 203. As shown in FIG. 2a, the buried oxide layer 208 specifically covers the drain layer 203 and the end surface of the gate dielectric layer 205 near the drain layer 203. In this embodiment, the buried oxide layer 208 is specifically made of silicon dioxide, and the buried oxide layer 208 protects the drain layer 203.

Further, on the basis of the above embodiment, in order to facilitate the electrical connection of the source layer 202, the drain layer 203 and the gate layer 204 with a corresponding word line, bit line, and source line, the transistor in this embodiment further includes: a first dielectric layer 41 and a second dielectric layer 42. At least a first metal wire 401 is provided in the first dielectric layer 41, at least a second metal wire 402 is provided in the second dielectric layer 42, and a third metal wire 403 is also provided in the first dielectric layer 41 or the second dielectric layer 42. In this embodiment, for the arrangement of the first dielectric layer 41, the second dielectric layer 42, the first metal wire 401, the second metal wire 402 and the third metal wire 403, reference may be made to the first embodiment, which will not be repeated in this embodiment.

Third Embodiment

This embodiment provides a device, which includes a 1T1R resistive random access memory according to any of the foregoing embodiments, where the device may be a Microcontroller Unit (Microcontroller Unit, MCU) or may also be other devices containing the above-mentioned 1T1R resistive random access memory.

Since the device provided in this embodiment includes the above-mentioned 1T1R resistive random access memory, and the minimum footprint of the transistor thereof is reduced to $4F^2$, which is greatly reduced compared with the transistor in the prior art, therefore the area of each 1T1R resistive random access memory cell is reduced, the memory density is increased and thus the device provided in this embodiment improves the memory density of the memory cells.

Fourth Embodiment

This embodiment provides a device, which includes a transistor according to any of the foregoing embodiments, where the device may be any device containing the above-mentioned transistors.

Since the device provided in this embodiment includes the above-mentioned transistor, and the minimum footprint of the transistor is reduced to $4F^2$, which is greatly reduced compared with the transistor in the prior art, therefore the area of each transistor is reduced, the transistor density is increased, and thus the device provided in this embodiment improves the transistor density of the device.

Fifth Embodiment

Figure 3:
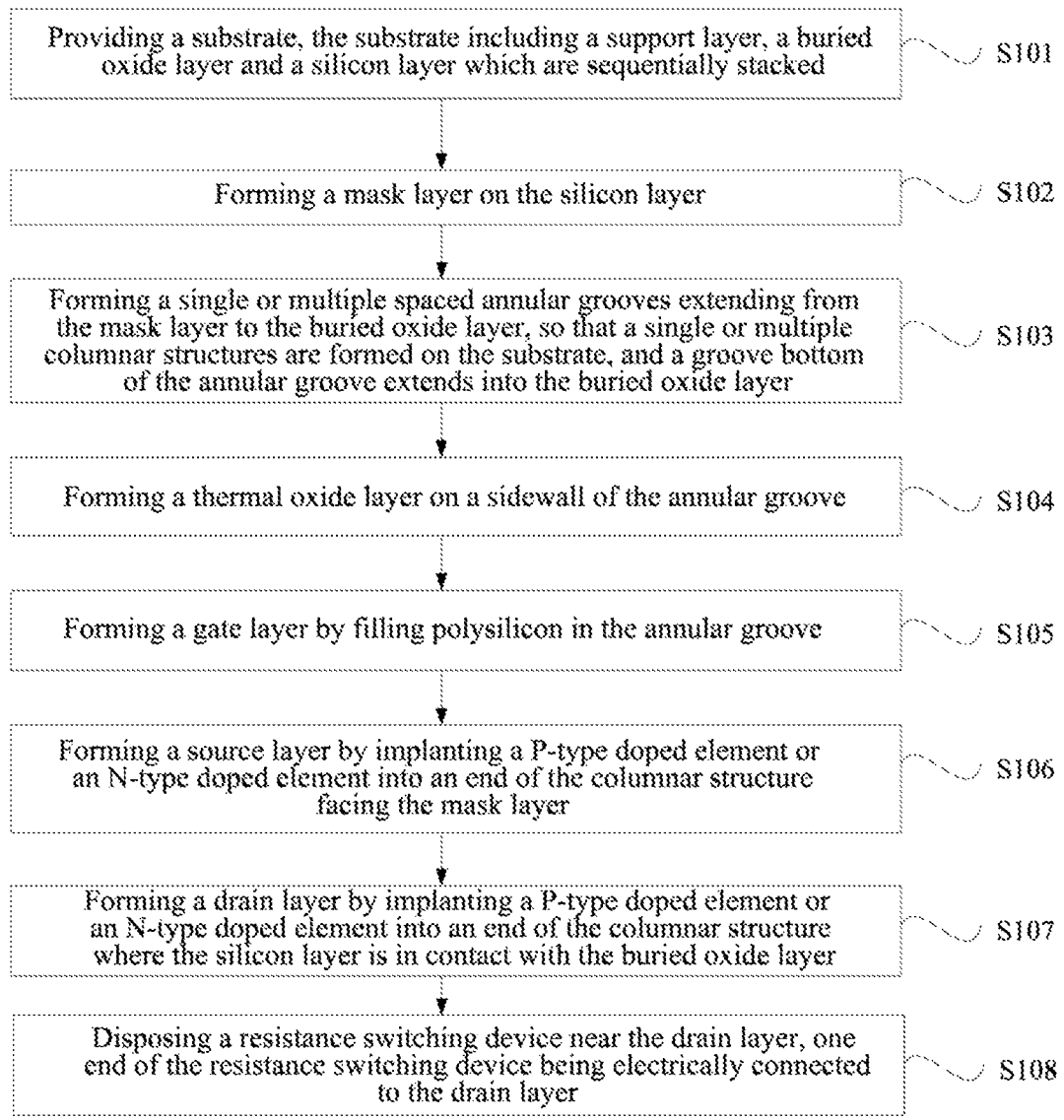
FIG. 3 is a schematic flowchart of a manufacturing method for a 1T1R resistive random access memory according to a fifth embodiment of the present disclosure.

FIG. 3 is a schematic flowchart of a manufacturing method for a 1T1R resistive random access memory according to the fifth embodiment of the present disclosure. FIGS. 4a-4j are structural schematic diagrams obtained by the steps of the manufacturing method for a 1T1R resistive random access memory according to the fifth embodiment of the present disclosure.

This embodiment provides a manufacturing method for a 1T1R resistive random access memory, which as shown in FIG. 3 includes the following steps:

S101: providing a substrate, where the substrate includes a support layer, a buried oxide layer 208 and a silicon layer which are sequentially stacked.

Figure 4A:
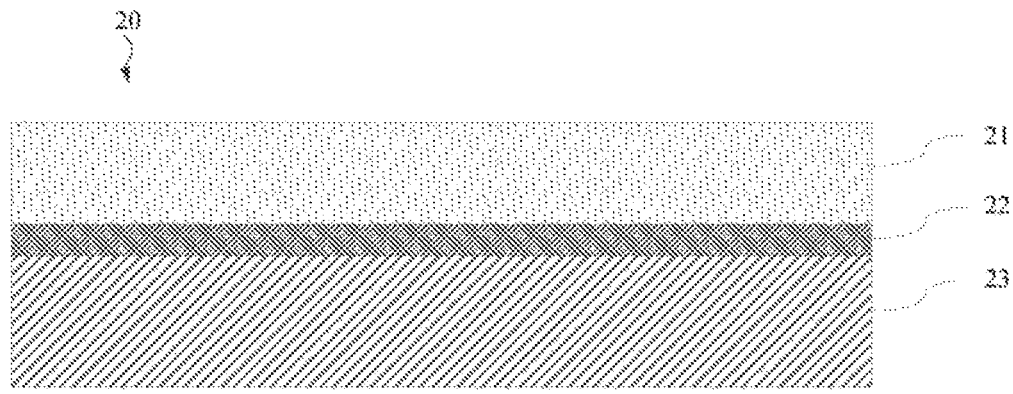
FIGS. 4a-4j are structural schematic diagrams obtained by steps of the manufacturing method for a 1T1R resistive random access memory according to the fifth embodiment of the present disclosure.

In this embodiment, as shown in FIG. 4a, there are a silicon layer 21, a buried oxide layer 22, and a support layer 23 from top to bottom in the substrate 20, that is, in this embodiment, the substrate 20 is an SOI wafer, i.e. silicon-on-insulator (SOI). In this embodiment, by adding the buried oxide layer 22 between the silicon layer 21 and the support layer 23, on the one hand, a parasitic capacitance can be reduced, and on the other hand, the buried oxide layer 22 plays a calibration role in the subsequent manufacturing of the gate layer 204 and facilitates the manufacturing of the drain layer 203. In this embodiment, the silicon layer 21, the buried oxide layer 22 and the support layer 23 may be made of single crystal silicon, silicon dioxide, and single crystal silicon, respectively, and the thicknesses of the silicon layer 21, the buried oxide layer 22 and the support layer 23 can be: 1 micrometer, 0.3 micrometer, and 725 micrometers, respectively. In this embodiment, when an N-type transistor is manufactured, the silicon layer 21 is doped with boron (P-type doping), and the doping concentration may be 1E15 cm$^{-3}$, and when a P-type transistor is manufactured, the silicon layer 21 is doped with phosphorus (N-type doping), and the doping concentration may be 1E15 cm$^{-3}$. It should be noted that the buried oxide layer 22 in the substrate 20 is subsequently thinned to form the buried oxide layer 208 shown in FIG. 2a.

S102: forming a mask layer 207 on the silicon layer 21.

Figure 4B:
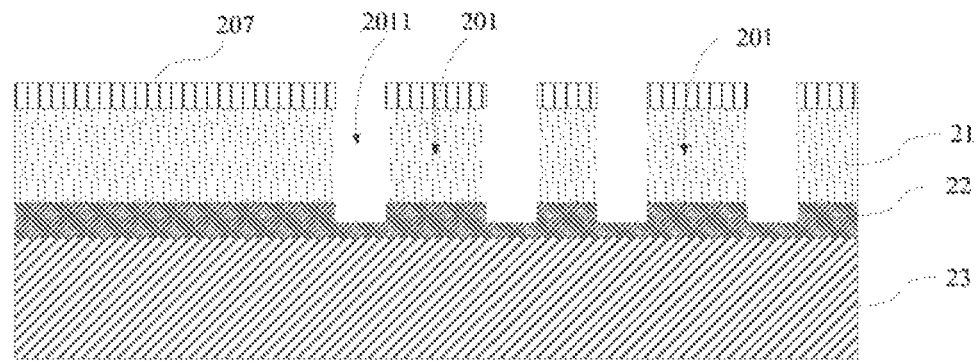

In this embodiment, as shown in FIG. 4b, a mask layer 207 is formed on the top surface of the silicon layer 21. Specifically, the mask layer 207 is formed as a hard mask by depositing silicon dioxide using a chemical vapor deposition (Chemical Vapor Deposition, CVD) process, and the mask layer 207 is formed to facilitate protection of the remaining silicon layer 21 when an annular groove is formed subsequently by etching. In this embodiment, the thickness of the mask layer 207 is greater than 180 nm.

S103: forming a single or multiple spaced annular grooves extending from the mask layer 207 to the buried oxide layer 22, so that a single or multiple columnar structures are formed on the substrate 20, and a groove bottom of the annular groove extends into the buried oxide layer 22.

In this embodiment, as shown in FIG. 4b, multiple spaced annular grooves 2011 are formed extending from the mask layer 207 to the buried oxide layer 22, and columnar structures are formed in the middle of the annular grooves 2011. Meanwhile, the bottoms of the annular grooves 2011 extend into the buried oxide layer 22, so that the columnar structures include the mask layer 207, the silicon layer 21 and the buried oxide layer 22. In this embodiment, the annular grooves 2011 can be specifically formed by dry etching. After the etching, the remaining thickness of the mask layer 207 is about 180 nm.

S104: forming a thermal oxide layer on a sidewall of the annular groove 2011.

Figure 4C:
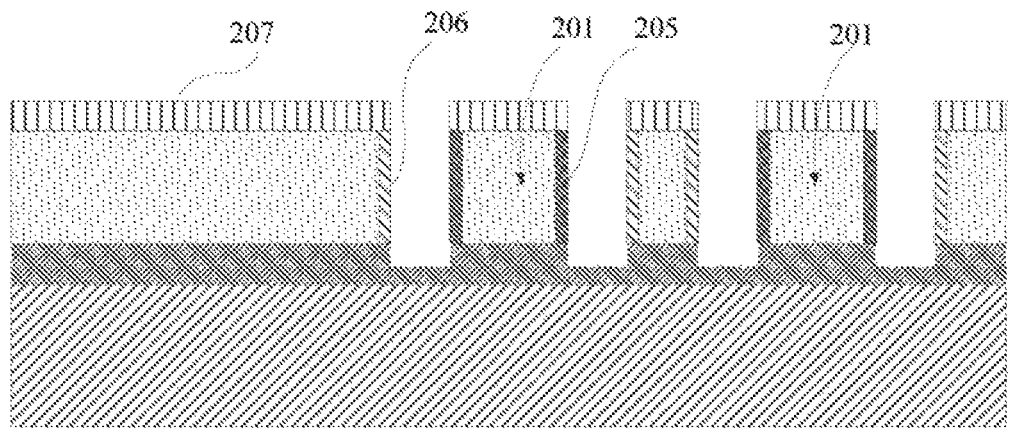

In this embodiment, when the thermal oxidation layer is formed, the specific condition of the thermal oxidation process is 850° C./1 hour, and the thickness of the formed thermal oxidation layer is 10 nanometers. The thermal oxide layer formed on the side surface of the columnar structure is used as the gate dielectric layer 205, and the thermal oxide layer formed elsewhere is used as the isolation layer 206 to isolate adjacent transistors. Specifically, as shown in FIG. 4c, include: forming a first thermal oxide layer (i.e. the gate dielectric layer 205) on an inner circular sidewall of the annular groove 2011, where the first thermal oxide layer is used to insulate the gate layer 204 from the silicon layer 21 of the columnar structure; and forming a second thermal oxidation layer (i.e. the isolation layer 206) on an outer circular sidewall of the annular groove 2011, where the second thermal oxidation layer is used to isolate two adjacent gate layers 204. In this embodiment, the thermal oxide layers are specifically made of silicon oxide.

S105: forming a gate layer 204 by filling polysilicon in the annular groove 2011.

Figure 4D:
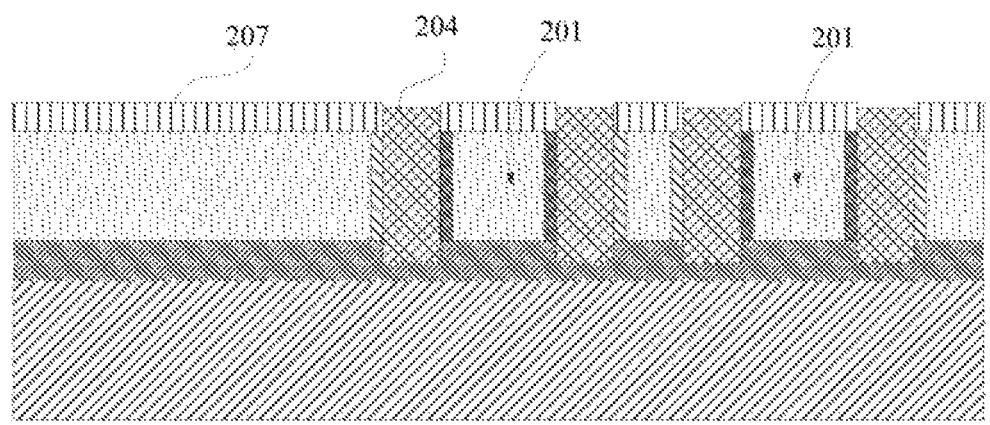

In this embodiment, as shown in FIG. 4d, a low pressure chemical vapor deposition (Low Pressure Chemical Vapor Deposition, LPCVD) process is specifically used to fill the annular groove 2011 with polysilicon to form a gate layer 204. The gate layer 204 is insulated from the columnar structure by the gate dielectric layer 205, and the gate layer 204 is isolated from the outer circular sidewall of the annular groove 2011 by the isolation layer 206. In this embodiment, the formed gate layer 204 is a annular gate layer formed around a columnar structure. After the excess polysilicon is removed by a chemical-mechanical planarization (Chemical-Mechanical Planarization, CMP for short) process, the remaining thickness of the mask layer 207 is about 120 nanometers.

S106: forming a source layer 202 by implanting a P-type doped element or an N-type doped element into an end of the columnar structure facing the mask layer 207.

Figure 4E:
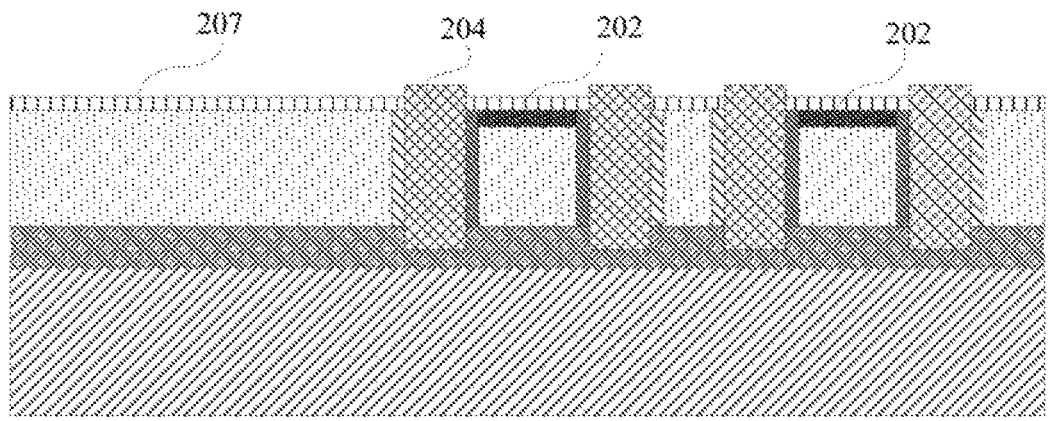

In this embodiment, as shown in FIG. 4e, a P-type doped element or an N-type doped element may be implanted into the end of the columnar structure facing the mask layer 207 by ion implantation, so that a heavily doped silicon is formed on the upper surface of the silicon layer 21, which is used as the source layer 202. In this embodiment, when an N-type transistor is manufactured, phosphorus is doped (N-type doping), and the doping concentration may be 1E19 cm$^{-3}$. When a P-type transistor is manufactured, boron is doped (P-type doping), and the doping concentration may be 1E19 cm$^{-3}$.

S107: forming a drain layer 203 by implanting a P-type doped element or an N-type doped element into an end of the columnar structure where the silicon layer 21 is in contact with the buried oxide layer 22.

Figure 4F:
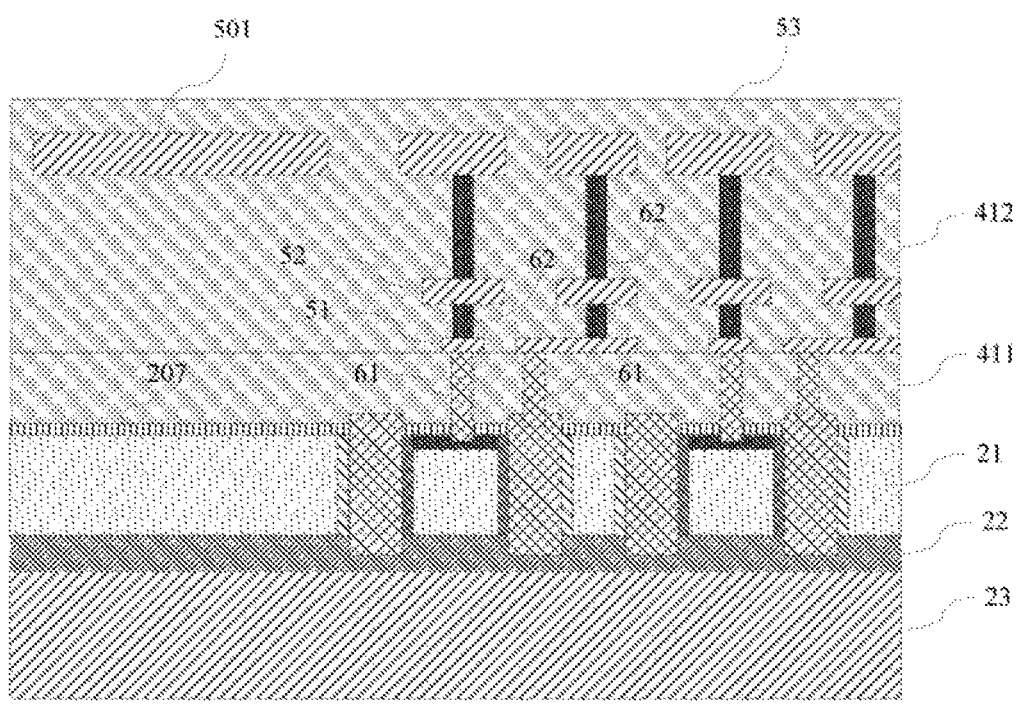
Figure 4G:
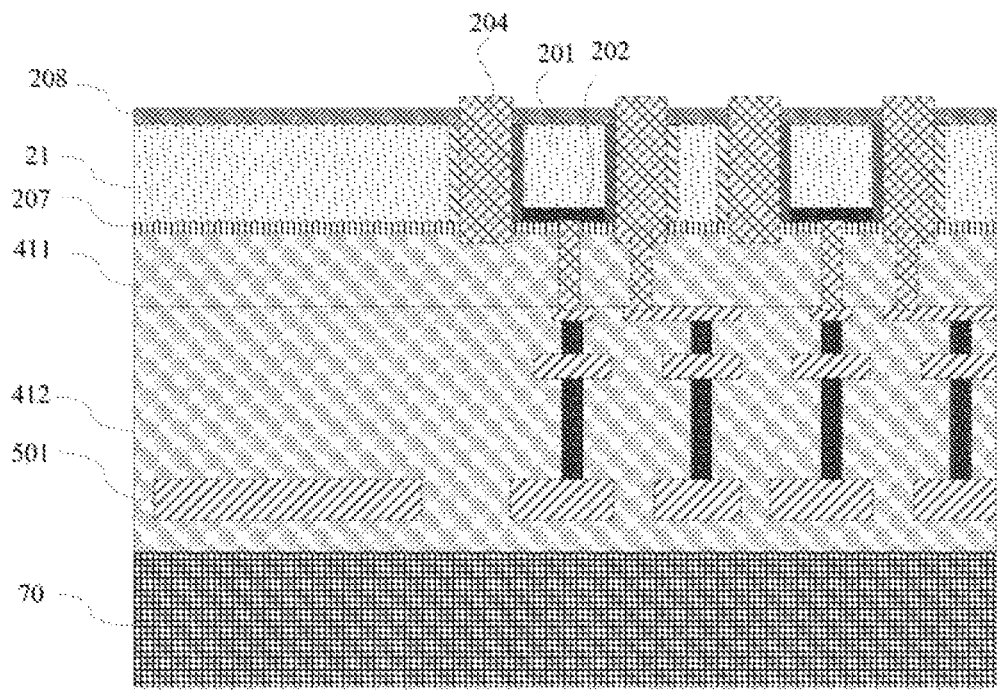
Figure 4H:
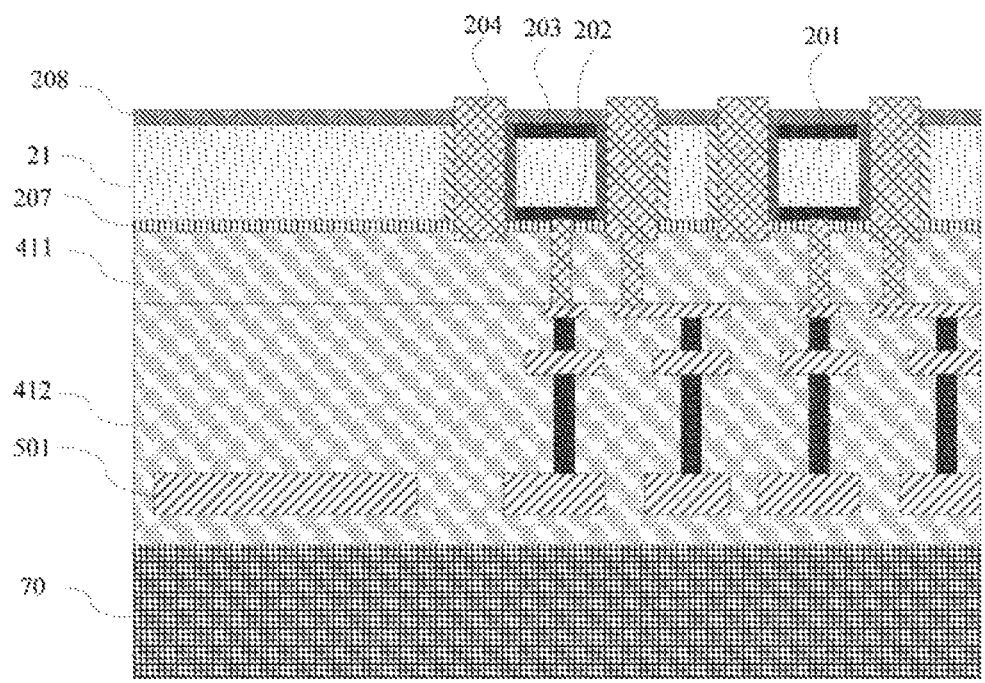

In this embodiment, the source layer 202, the gate layer 204 and the gate dielectric layer 205 of the transistor are formed through steps 101-106. In order to form a drain layer 203 on the back side of the substrate 20, at this time, the substrate 20 is turned over (as shown in FIG. 4g), the support layer 23 faces upward, the silicon layer 21 faces downward, and the drain layer 203 is formed on the back side of the SOI wafer. The silicon layer 21 between the drain layer 203 and the source layer 202 is a channel layer 201. In this way, a transistor is formed through steps 101-107. In this embodiment, phosphorus (N-type transistor) or boron (P-type transistor) is specifically implanted into an end of the columnar structure near the buried oxide layer 22 by an ion implantation method to form the drain layer 203. The doping concentration may specifically be 1E19 cm$^{-3}$. The doped region is annealed with a laser annealing process to activate and repair lattice damage. Due to the characteristics of instantaneous high temperature, the laser annealing can allow heat to be concentrated in the surface region, so as not to damage the metal below the surface.

S108: disposing a resistance switching device 30 near the drain layer 203, where one end of the resistance switching device 30 is electrically connected to the drain layer 203.

In this embodiment, after the transistor is formed, start to manufacture the resistance switching device and the metal wires. Specifically, the resistance switching device 30 is disposed near the drain layer 203. Since the source layer 202 is located on the front side of the substrate 20 and the drain layer 203 is located on the back side of the substrate 20. Therefore, in this embodiment, the resistance change device 30 is disposed on the back side of the substrate 20, that is, the resistance switching device is manufactured on the back side of the SOI substrate in this embodiment. Meanwhile, in this embodiment, one end of the resistance switching device 30 is electrically connected to the drain layer 203, and a 1T1R resistive random access memory is finally manufactured.

In this embodiment, a drain layer 203 and a source layer 202 are respectively disposed on the front and back sides of a substrate 20 including a silicon layer 21, a buried oxide layer 22 and a support layer 23, that is, a vertical columnar transistor is made based on an SOI substrate 20. Compared with the prior art, the manufacturing process is simplified. Meanwhile, the RRAM process needs to be completed in a special processing plant, because the manufacturing of the resistance switching device 30 involves some special materials, such as Au, Ag, Pt, etc. used as the material of electrode and Pr$_{0.7}$Ca$_{0.3}$MnO$_3$ (PCMO) used as the material of the resistance switching layer 32, that are incompatible with the traditional CMOS (Complementary Metal Oxide Semiconductor) process. In this disclosure, the resistance switching device 30 can be made on the back side of the SOI wafer (i.e. the substrate 20), so that the transistor process and the RRAM process can be carried out in stages (the process of making resistance switching device and subsequent metal wire is collectively called RRAM), which provides more possibilities for the option of the material of the resistance switching device 30. Meanwhile, the minimum footprint of the transistor in the 1T1R resistive random access memory manufactured by this disclosure is only 4F$^2$ and compared with the transistor in the prior art, the footprint of the transistor is greatly reduced, which leads to a great reduction in the area of each 1T1R resistive random access memory cell and an increase in the memory density. Therefore, the manufacturing method for the 1T1R resistive random access memory provided in this embodiment simplifies the manufacturing process of the 1T1R resistive random access memory, provides more possibilities for the option of the material of the resistance switching device 30, and reduces the footprint of the transistor and increases the memory density, thereby solving the problem of the existing 1T1R resistive random access memory that the memory density is limited due to that the area of transistor cannot be reduced.

Further, on the basis of the above embodiments, in this embodiment, before step 106, the method further includes: reducing the thickness of the masking layer 207 to 8 nm to 20 nm. That is, in this embodiment, before implanting a P-type doped element or an N-type doped element into the columnar structure to form the source layer 202, the thickness of the mask layer 207 needs to be reduced, which is convenient for the P-type doped element or the N-type doped element to be implanted into the silicon layer 21. In this embodiment, as shown in FIG. 4e, the thickness of the mask layer 207 is reduced to about 10 nm.

Further, on the basis of the above embodiments, before step 107, that is, before implanting a P-type doped element or an N-type doped element into the silicon layer 21 of the columnar structure near the buried oxide layer 22 to form the drain layer 203, as shown in FIG. 4g, this embodiment further includes: removing the support layer 23 and reducing the thickness of the buried oxide layer 22 to 8 nm to 20 nm, to form the buried oxide layer 208 in FIG. 2a. Specifically, it is divided into three stages: the first stage is to use mechanical thinning to reduce the thickness of the support layer 23 from 725 micrometers to about 20 micrometers, where a standard mechanical thinning process includes rough grinding, fine grinding, polishing, etc.; the second stage is to use dry etching to remove the remaining silicon of the support layer 23 completely, where the etching is stopped after reaching the buried oxide layer 22, and the dry etching uses a recipe with a selection ratio of 10:1 or more; the third stage is to use wet etching to remove a certain thickness of the buried oxide layer 22. The final thickness of the remaining buried oxide layer 22 is about 10 nanometers and the structure of that is shown in FIG. 4g. After the buried oxide layer 22 is thinned, a P-type doped element or an N-type doped element is implanted by ion implantation to form the drain layer 203.

Further, on the basis of the above embodiment, in order to facilitate the electrical connection of the gate layer 204 and the source layer 202 with the source line, the word line, and other circuits, specifically, after step 106, a front metal interconnection wire needs to be produced. Specifically, the method also includes: forming a lower dielectric layer 411 on the mask layer 207 and on an end surface of the gate layer 204 near the mask layer 207, as shown in FIG. 4f; forming a gate metal layer, a source metal layer, and first pads 501 that is electrically connected to the gate metal layer and the source metal layer on the lower dielectric layer 411, covering a first inter-metal dielectric layer 412 on the lower dielectric layer 411 on which the gate metal layer, the source metal layer and the first pads are formed, where the gate metal layer and the source metal layer are electrically connected to the gate layer and the source layer through contacts (e.g. the first contact 61 and the second contact 62) respectively, and disposing a slide wafer 70 on the first inter-metal dielectric layer 412 (as shown in FIG. 4g), where the first inter-metallic dielectric layer 412 and the slide wafer 70 are fixed together by a bonding method, and the slide wafer 70 plays a supporting role in the subsequent thinning process of removing the support layer 23 and the buried oxide layer 22. In this embodiment, the lower dielectric layer 411 and the first inter-metallic dielectric layer 412 form the aforementioned first dielectric layer 41 together. In this embodiment, the gate metal layer and the source metal layer each include: a first metal layer 51, a second metal layer 52 and a third metal layer 53. That is, the gate metal layer is composed of a first metal layer 51, a second metal layer 52 and a third metal layer 53, and the source metal layer is also composed of a first metal layer 51, a second metal layer 52 and a third metal layer 53.

In this embodiment, it should be noted that the lower dielectric layer 411 may be only provided with the source metal layer and the first pads 501 that is electrically connected to the source metal layer. That is, in this embodiment, the metal layer for electrically connecting with the gate layer 204 is not provided in the first dielectric layer 41, and the gate metal layer may be provided on the upper dielectric layer 421, that is, the gate metal layer is provided in the second dielectric layer 42.

It should be noted that during manufacturing the first metal layer 51, the second metal layer 52 and the third metal layer 53, each metal layer needs to be covered with a first inter-metal dielectric layer 412, and then another metal layer is then disposed on the first inter-metal dielectric layer 412 until all the metal layers are disposed. In this embodiment, there are three metal layer (i.e. the first metal layer 51, the second metal layer 52, and the third metal layer 53) in the first dielectric layer 41. In other embodiments, the first dielectric layer 41 may have one or more metal layers, and the specific number of layers is determined according to the requirements of circuit wiring.

In this embodiment, the first pads 501 and the third metal layer 53 are electrically connected, where the first pads 501 will subsequently be perform with a pad open process, so that the first pads 501 can be electrically connected to an external circuit board.

Figure 4I:
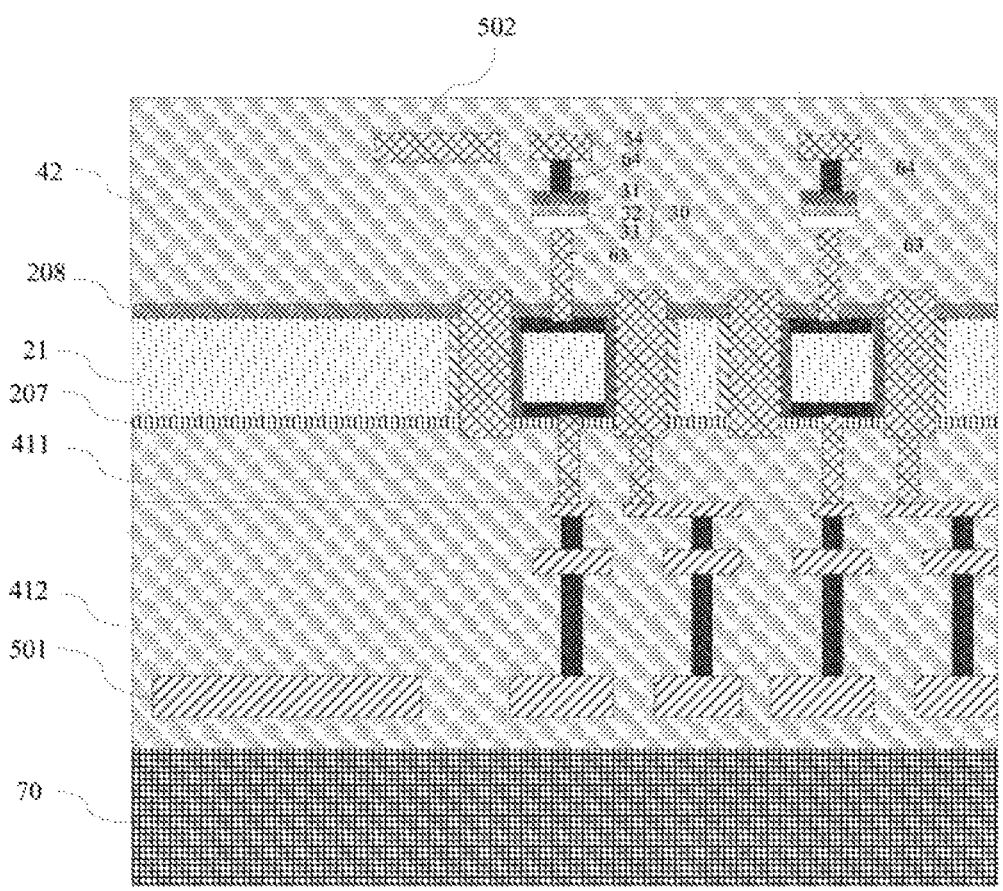

Further, on the basis of the above embodiment, in this embodiment, in order to electrically connect the drain layer 203 with the resistance switching device 30 and the bit line, therefore, after the above step 107, as shown in FIG. 4i, the method further includes: forming an upper dielectric layer 421 on the buried oxide layer 22 and on an end surface of the gate layer 204 near the buried oxide layer 22, and correspondingly, the disposing a resistance switching device 30 near the drain layer 203 specifically includes: disposing the resistance switching device 30 on the upper dielectric layer 421 at a position corresponding to the drain layer 203, where the resistance switching device 30 includes a lower electrode 33, a resistance switching layer 32 and an upper electrode 31 that are stacked, and the lower electrode 33 is electrically connected to the drain layer 203 through a third contact 63.

In this embodiment, after disposing the resistance switching device 30, the method further includes:

disposing a second inter-metal dielectric layer 422 on the upper dielectric layer 421 on which the resistance switching device 30 is formed; forming a drain metal layer (i.e. the fourth metal layer 54) and a second pads 502 that is electrically connected to the drain metal layer on the second inter-metal dielectric layer 422, where the drain metal layer is electrically connected to the upper electrode 31 through the fourth contact 64; covering a third inter-metal dielectric layer 423 on the second inter-metal dielectric layer 422 on which the drain metal layer and the second pads are formed. In this embodiment, the second inter-metal dielectric layer 422 and the third inter-metal dielectric layer 423 constitute the above-mentioned second dielectric layer 42, where the number of layers of the second inter-metallic dielectric layer 422 and the third inter-metallic dielectric layer 423 is specifically related to the metal layer disposed in the second dielectric layer 42, and the second inter-metal dielectric layer 422 and the third inter-metal dielectric layer 423 are only used to distinguish the inter-metal dielectric layers. In this embodiment, the upper dielectric layer 421, the second inter-metal dielectric layer 422 and the third inter-metal dielectric layer 423 form the above-mentioned second dielectric layer 42, where the upper dielectric layer 421, the second inter-metal dielectric layer 422 and the third inter-metal dielectric layer 423 are all insulating layers that are insulated from the metal layer. In this embodiment, the second pads 502 will be subsequently performed with a pad open process, so that the second pads 502 can be electrically connected to an external circuit board.

Figure 4J:
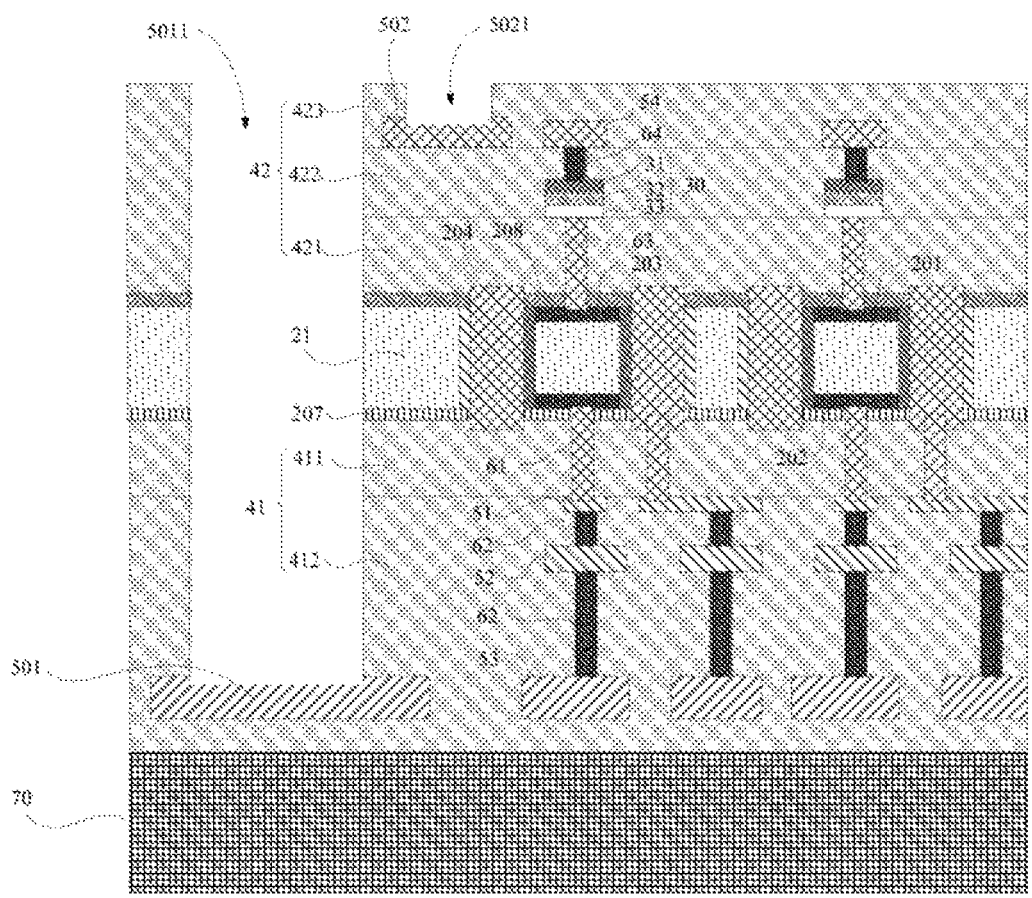

In this embodiment, after covering the third inter-metal dielectric layer 423 on the second inter-metal dielectric layer 422 on which the drain metal layer and the second pads 502 are formed, as shown in FIG. 4j, the method further includes: opening a first opening 5011 and a second opening 5021 on the third inter-metal dielectric layer 423 at positions corresponding to the first pads 501 and the second pads 502, respectively, where the first opening 5011 extends to the surface of the first pads 501, and the second opening 5021 extends to the surface of the second pads 502. That is, a pad open process is performed, so that the transistor and the resistance switching device 30 are electrically connected to other circuits on the circuit board through the first pads 501 and the second pads 502.

In the description of the present disclosure, it should be noted that the terms "dispose", "connect with", and "connect to" should be understood in a broad sense unless otherwise specified and limited. For example, a connection may be a fixed connection, or may be an indirect connection through an intermediate medium, or may also be an internal connection of two components or an interaction between two components. For those skilled in the art, the specific meanings of the above terms in the present disclosure can be understood according to specific situations.

In the description of the present disclosure, it should be understood that the orientational or positional relationship indicated by the terms "up", "down", "front", "back", "vertical", "horizontal", "top", "bottom", "inside", "outside" and the like are based on the orientational or positional relationship shown in the drawings, and are only for the convenience of describing the present disclosure and simplifying description, but not to indicate or imply that a device or component referred to must have a specific orientation, or be constructed and operated in a specific orientation, and therefore should not be understood as a limitation to the present disclosure. In the description of the present disclosure, "multiple" means two or more, unless it is specifically and precisely specified otherwise.

The terms "first", "second", "third", "fourth", etc. (if any) in the description and claims of the present disclosure and the above-mentioned drawings are used to distinguish similar objects, and need not be used for describing a particular order or sequence. It should be understood that the data used in this way are interchangeable where appropriate, so that the embodiments of the present disclosure described herein can be implemented in an order other than those illustrated or described herein, for example. Furthermore, the terms "include" and "have" and any of their variations are intended to cover non-exclusive inclusions, for example, a process, method, system, product, or device that includes a series of steps or units need not be limited to those explicitly listed steps or units, but may instead include other steps or units not explicitly listed or inherent to these processes, methods, products or equipment.

Finally, it should be stated that: the above embodiments are only used to illustrate the technical solution of the present disclosure, but not to limit. Although the present disclosure has been described in detail with reference to the foregoing embodiments, those skilled in the art will understand: they can still modify the technical solutions described in the foregoing embodiments, or replace some or all of the technical features equivalently, and these modifications or replacements do not deviate the essence of the corresponding technical solutions from the scope of the technical solutions of the embodiments of the present disclosure.

What is claimed is:

1. A 1T1R resistive random access memory, comprising: a memory cell array composed of multiple 1T1R resistive random access memory cells, each 1T1R resistive random access memory cell comprising a transistor and a resistance switching device (30); wherein
   the transistor comprises a channel layer (201), a gate layer (204) insulated from the channel layer (201), and a drain layer (203) and a source layer (202) that are disposed on the channel layer (201), wherein the drain layer (203) and the source layer (202) are vertically distributed on the channel layer (201);
   the resistance switching device (30) is disposed near the drain layer (203), and two ends of the resistance switching device (30) are used to connect to the drain layer (203) and a bit line, respectively, and the gate layer (204) is used to electrically connect to a word line, and the source layer (202) is used to connect to a source line;
   the transistor further comprising:
   a mask layer (207), wherein the mask layer (207) covers at least the source layer (202) or covers at least the drain layer (203).

2. The 1T1R resistive random access memory according to claim 1, further comprising:
   an isolation layer (206), wherein the isolation layer (206) is disposed around an outer surface of the gate layer (204) and is used to isolate adjacent transistors.

3. The 1T1R resistive random access memory according to claim 1, further comprising: a buried oxide layer (208), wherein one of the buried oxide layer (208) and the mask layer (207) covers at least the source layer (202), and the other covers at least the drain layer (203).

4. The 1T1R resistive random access memory according to claim 3, further comprising:
   a first dielectric layer (41), wherein the first dielectric layer (41) is provided on one end surface of the transistor, and at least a first metal wire (401) is provided in the first dielectric layer (41), and the first metal wire (401) is used to electrically connect one of the source layer (202) and the drain layer (203) near the first dielectric layer (41) to a corresponding wire;
   a second dielectric layer (42), wherein the second dielectric layer (42) is disposed on one end surface of the transistor facing away from the first dielectric layer, and at least a second metal wire (402) is provided in the second dielectric layer (42), wherein the second metal wire (402) is used to electrically connect one of the source layer (202) and the drain layer (203) near the second dielectric layer (42) to a corresponding wire;
   a slide wafer (70), wherein the slide wafer (70) is disposed on one of the first dielectric layer (41) and the second dielectric layer (42) far from the buried oxide layer (208).

5. The 1T1R resistive random access memory according to claim 1, wherein the resistance switching device (30) comprises a lower electrode (33), a resistance switching layer (32) and an upper electrode (31) which are sequentially stacked, and wherein the lower electrode (33) is electrically connected to the drain layer (203), and the upper electrode (31) is electrically connected to the bit line.

6. The 1T1R resistive random access memory according to claim 3, further comprising:
   a first dielectric layer (41), wherein the first dielectric layer (41) is provided on one end surface of the transistor, and at least a first metal wire (401) is provided in the first dielectric layer (41), and the first metal wire (401) is used to electrically connect one of the source layer (202) and the drain layer (203) near the first dielectric layer (41) to a corresponding wire;
   a second dielectric layer (42), wherein the second dielectric layer (42) is disposed on one end surface of the transistor facing away from the first dielectric layer, and at least a second metal wire (402) is provided in the second dielectric layer (42), wherein the second metal wire (402) is used to electrically connect one of the source layer (202) and the drain layer (203) near the second dielectric layer (42) to a corresponding wire;
   wherein a third metal wire (403) is further disposed in the first dielectric layer (41) or the second dielectric layer (42), wherein the third metal wire (403) is used to electrically connect the gate layer (204) to a corresponding word line;
   wherein each of the first metal wire (401), the second metal wire (402) and the third metal wire (403) comprises at least one contact and at least one metal layer, the gate layer (204), the source layer (202) and the drain layer (203) are respectively electrically connected to a corresponding metal layer through the contact, the metal layer in the first dielectric layer (41) is electrically connected to first pads (501) exposed on the first dielectric layer (41), and the metal layer in the second dielectric layer (42) is electrically connected to a second pads (502) exposed on the second dielectric layer (42).

7. The 1T1R resistive random access memory according to claim 1, wherein the channel layer (201) is a columnar structure, and the gate layer (204) is a an annular structure disposed around a sidewall of the columnar structure.

8. The 1T1R resistive random access memory according to claim 3, wherein the mask layer, the buried oxide layer and the isolation layer are all made of silicon oxide.

9. A transistor, comprising a channel layer (201), a gate layer (204) insulated from the channel layer, and a drain layer (203) and a source layer (202) disposed on the channel layer (201), wherein the drain layer (203) and the source layer (202) are vertically distributed on the channel layer (201);

wherein the transistor further comprises:
a mask layer (207), wherein the mask layer (207) covers at least the source layer (202) and an end surface of a gate dielectric layer (205) near the source layer (202), the gate dielectric layer (205) disposed between the gate layer (204) and the channel layer (201), and the gate dielectric layer (205) and the source layer (202) disposed on the same side of the mask layer (207).

10. The transistor according to claim 9, further comprising: an isolation layer (206), wherein the isolation layer (206) is disposed around an outer surface of the gate layer (204) and is used to isolate adjacent transistors.

11. The transistor according to claim 9, further comprising: a buried oxide layer (208), wherein the buried oxide layer (208) covers at least the drain layer (203).

12. A method for manufacturing a 1T1R resistive random access memory according to claim 1, wherein the method comprises:
providing a substrate which comprises a support layer, a buried oxide layer and a silicon layer which are sequentially stacked;
forming a mask layer on the silicon layer;
forming a single or multiple spaced annular grooves extending from the mask layer to the buried oxide layer, so that a single or multiple columnar structures are formed on the substrate, and a groove bottom of the annular groove extends into the buried oxide layer;
forming a thermal oxide layer on a sidewall of the annular groove;
forming a gate layer by filling polysilicon in the annular groove;
forming a source layer by implanting a P-type doped element or an N-type doped element into an end of the columnar structure facing the mask layer;
forming a drain layer by implanting a P-type doped element or an N-type doped element into an end of the columnar structure where the silicon layer is in contact with the buried oxide layer;
disposing a resistance switching device near the drain layer, wherein one end of the resistance switching device is electrically connected to the drain layer.

13. The manufacturing method according to claim 12, before the implanting a P-type doped element or an N-type doped element into an end of the columnar structure facing the mask layer, further comprising:
reducing a thickness of the masking layer to 8 nm to 20 nm.

14. The manufacturing method according to claim 12, wherein the forming a thermal oxide layer on a sidewall of the annular groove comprises:
forming a first thermal oxide layer on an inner circular sidewall of the annular groove, wherein the first thermal oxide layer is used to insulate the gate layer from the silicon layer of the columnar structure;
forming a second thermal oxidation layer on an outer circular sidewall of the annular groove, wherein the second thermal oxidation layer is used to isolate two adjacent gate layers.

15. The manufacturing method according to claim 12, before the implanting a P-type doped element or N-type doped element into an end of the columnar structure where the silicon layer is in contact with the buried oxide layer, further comprising:

removing the support layer;
reducing a thickness of the buried oxide layer to 8 nm to 20 nm.

16. The manufacturing method according to claim 12, after the implanting a P-type doped element or an N-type doped element into an end of the columnar structure facing the mask layer, further comprising:
forming a lower dielectric layer on the mask layer and on an end surface of the gate layer near the mask layer;
forming a gate metal layer, a source metal layer and first pads that is electrically connected to the gate metal layer and the source metal layer, on the lower dielectric layer;
covering a first inter-metal dielectric layer on the lower dielectric layer on which the gate metal layer, the source metal layer and the first pads are formed, wherein the gate metal layer and the source metal layer are electrically connected to the gate layer and the source layer through a contact, respectively;
disposing a slide wafer on the first inter-metal dielectric layer.

17. The manufacturing method according to claim 16, after the implanting a P-type doped element or N-type doped element into an end of the columnar structure where the silicon layer is in contact with the buried oxide layer, further comprising:
forming an upper dielectric layer on the buried oxide layer and on an end surface of the gate layer near the buried oxide layer;
the disposing a resistance switching device near the drain layer includes:
disposing the resistance switching device on the upper dielectric layer at a position corresponding to the drain layer, wherein the resistance switching device comprises a lower electrode, a resistance switching layer and an upper electrode that are stacked, and the lower electrode is electrically connected to the drain layer through a contact.

18. The manufacturing method according to claim 17, after the disposing the resistance switching device on the upper dielectric layer at a position corresponding to the drain layer, further comprising:
disposing a second inter-metal dielectric layer on the upper dielectric layer on which the resistive random device is formed;
forming a drain metal layer and a second pads that is electrically connected to the drain metal layer, on the second inter-metal dielectric layer, wherein the drain metal layer is electrically connected to the upper electrode through a contact;
covering a third inter-metal dielectric layer on the second inter-metal dielectric layer on which the drain metal layer and the second pads are formed.

19. The manufacturing method according to claim 18, after the covering a third inter-metal dielectric layer on the second inter-metal dielectric layer on which the drain metal layer and the second pads are formed, further comprising:
opening a first opening and a second opening on the third inter-metal dielectric layer at positions corresponding to the first pads and the second pads, respectively, wherein the first opening extends to a surface of the first pads, and the second opening extends to a surface of the second pads.

* * * * *